United States Patent

Ogawa

(10) Patent No.: US 9,666,439 B2
(45) Date of Patent: May 30, 2017

(54) METHOD OF MANUFACTURING A SEMICONDUCTOR DEVICE AND RECORDING MEDIUM

(71) Applicant: HITACHI KOKUSAI ELECTRIC INC., Tokyo (JP)

(72) Inventor: Arito Ogawa, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/070,387

(22) Filed: Mar. 15, 2016

(65) Prior Publication Data

US 2016/0284552 A1 Sep. 29, 2016

(30) Foreign Application Priority Data

Mar. 27, 2015 (JP) .................. 2015-065955

(51) Int. Cl.
| | |
|---|---|
| H01L 21/285 | (2006.01) |
| H01L 21/28 | (2006.01) |
| C23C 16/02 | (2006.01) |
| C23C 16/34 | (2006.01) |
| C23C 16/455 | (2006.01) |
| H01L 21/3205 | (2006.01) |
| H01L 21/768 | (2006.01) |

(52) U.S. Cl.
CPC .... H01L 21/28562 (2013.01); C23C 16/0272 (2013.01); C23C 16/34 (2013.01); C23C 16/45546 (2013.01); H01L 21/28088 (2013.01); H01L 21/32051 (2013.01); H01L 21/76876 (2013.01); H01L 21/76843 (2013.01)

(58) Field of Classification Search
CPC ......... H01L 21/28562; H01L 21/76876; H01L 21/32051; H01L 21/28088; H01L 21/76843; C23C 16/45546; C23C 16/0272; C23C 16/34
See application file for complete search history.

(56) References Cited

U.S. PATENT DOCUMENTS

| | | | |
|---|---|---|---|
| 2010/0297846 A1 | 11/2010 | Kaga et al. | |
| 2013/0065391 A1* | 3/2013 | Ogawa ................... | C23C 14/14 438/658 |
| 2014/0342573 A1 | 11/2014 | Hirose et al. | |

FOREIGN PATENT DOCUMENTS

| | | |
|---|---|---|
| JP | 2011-006783 A | 1/2011 |
| JP | 2013-076157 A | 4/2013 |
| WO | 2013/027549 A1 | 2/2013 |

* cited by examiner

*Primary Examiner* — Kyoung Lee
(74) *Attorney, Agent, or Firm* — Volpe and Koenig, P.C.

(57) ABSTRACT

A method of manufacturing a semiconductor device includes forming a seed layer containing a metal element on a substrate by performing a first process and a second process in a time-division manner. The first process supplying and exhausting organic metal-containing gas containing the metal element to the substrate. The second process supplying and exhausting inorganic metal-containing gas containing the metal element to the substrate, and forming a metal-containing nitride film on the substrate on which the seed layer is formed using the seed layer as a seed by performing a third process and a fourth process in a time-division manner. The third process supplying and exhausting the inorganic metal-containing gas to the substrate. The fourth process supplying and exhausting nitrogen-containing gas to the substrate.

12 Claims, 8 Drawing Sheets

METHOD OF MANUFACTURING A SEMICONDUCTOR DEVICE AND RECORDING MEDIUM

BACKGROUND OF THE INVENTION

Field of the Invention

The present invention relates to a method of manufacturing a semiconductor device and a recording medium.

Description of the Related Art

Due to high integration and high performance of a semiconductor device such as a MOSFET (Metal-Oxide-Semiconductor Field Effect Transistor), various types of metal-containing films have been used as an electrode and wiring. Among them, for a gate electrode and a capacitor electrode of DRAM (Dynamic Random Access Memory), from the viewpoint of oxidation resistance, electric resistivity, work function, and the like, a metal carbide-based metal-containing film and a metal nitride-based metal-containing film have been often used (JP 2011-6783 A).

SUMMARY OF THE INVENTION

Due to high integration and high performance of a memory, a metal-containing film thinner than conventional one has been required. However, the metal-containing film often increases its resistivity due to thinning. This is caused by that grain size of a thin film may become small, and that a surface of the thin film may be oxidized. Increasing resistivity of the metal-containing film is not desirable, and lower resistivity is desired.

An object of the present invention is to provide a technique capable of suppressing an increase in resistivity of the metal-containing film.

According to one aspect of the present invention, a technique is provided including: forming a seed layer containing a metal element on a substrate by performing a first process and a second process in a time-division manner a predetermined number of times, the first process supplying and exhausting organic metal-containing gas containing the metal element to the substrate, the second process supplying and exhausting inorganic metal-containing gas containing the metal element to the substrate; and forming a metal-containing nitride film on the substrate on which the seed layer is formed using the seed layer as a seed by performing a third process and a fourth process in a time-division manner a predetermined number of times, the third process supplying and exhausting the inorganic metal-containing gas to the substrate, the fourth process supplying and exhausting nitrogen-containing gas to the substrate.

According to the present invention, it is possible to provide a technique capable of suppressing an increase in resistivity of a metal-containing film.

DETAILED DESCRIPTION OF THE PREFERRED EMBODIMENTS

Figure 1:
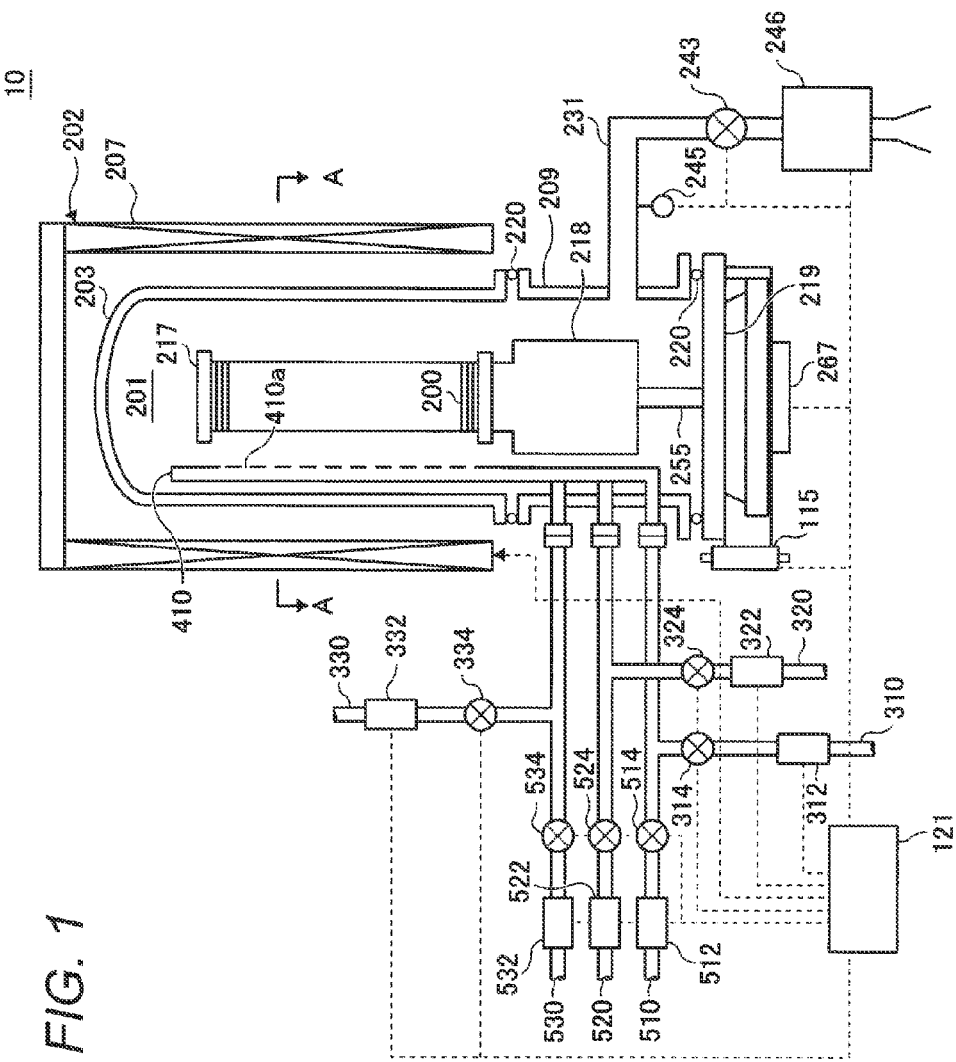
FIG. 1 is a schematic diagram of a processing furnace of a substrate processing apparatus suitably used in an embodiment of the present invention, and is a diagram illustrating the processing furnace part with a longitudinal section.

As a cause of an increase in the resistivity of a metal-containing film, it is considered that grain size of the metal-containing film can become small that is formed on a base. The present inventors have conducted research eagerly and have found that, by forming a seed layer (low nuclear density film) having a lower nuclear density than a normal metal-containing film on the base before forming the metal-containing film, in comparison with a case of directly forming the metal-containing film on the base, it is possible to increase the grain size of the metal-containing film to be directly formed on the seed layer. It is considered that, when the metal-containing film is formed, since the metal-containing film is formed using a nucleus composing a layer formed as the seed layer as a seed (seeding), the grain size of the metal-containing film is increased when the nuclear density of the seed layer is low. By increasing the grain size of the metal-containing film, in comparison with the case of directly forming the metal-containing film on the base, it is possible to decrease the resistivity of the metal-containing film.

The seed layer of a low nuclear density can be a layer having composition in which the main constituent element is the same as the metal-containing film, and can be a layer that has a metal element same as the metal-containing film but in which the main constituent element is not completely the same, and can be a layer having a different metal element from the metal-containing film. To form the seed layer of a low nuclear density, a metal source can be used as a source when forming the seed layer, the metal source increasing a deposition rate to be faster than the rate of a metal source that is used when forming the metal-containing film.

For example, when forming a titanium nitride film (TiN film) having titanium (Ti) as a metal element as the metal-containing film, there is a case of using inorganic Ti-containing gas and nitriding gas, or a case of using organic Ti-containing gas and nitriding gas; in any of the cases, since the deposition rate is 0.02 to 0.03 Å/cycle, a nucleus is easily formed at a high density. Meanwhile, inventors have found that, by forming the TiN film using the inorganic Ti-containing gas, the organic Ti-containing gas, and the nitriding gas, it is possible to increase the deposition rate to 2 to 3 Å/cycle. Since it is possible to form the nucleus of a low density by increasing the deposition rate, when forming the TiN film as the seed layer, it is preferable to form the TiN film using the inorganic Ti-containing gas, the organic Ti-containing gas, and the nitriding gas. When forming the seed layer as the layer that has the metal element same as the metal-containing film but in which the main constituent element is not completely the same, by forming a Ti film as the seed layer by using, for example, the inorganic Ti-containing gas and the organic Ti-containing gas, similarly it is possible to form the seed layer of a low nuclear density. That is, when forming the seed layer as the layer having the Ti same as that of the TiN film, it is possible to form the Ti film as the seed layer by using the inorganic Ti-containing gas and the organic Ti-containing gas. Details are described below.

First Embodiment of the Present Invention

A suitable first embodiment of the present invention is described below with reference to FIG. 1 and FIG. 2. A substrate processing apparatus 10 is configured as one example of an apparatus used in a substrate processing process that is one process of a manufacturing process of a semiconductor device (device).

(1) Configuration of Processing Furnace

Figure 2:
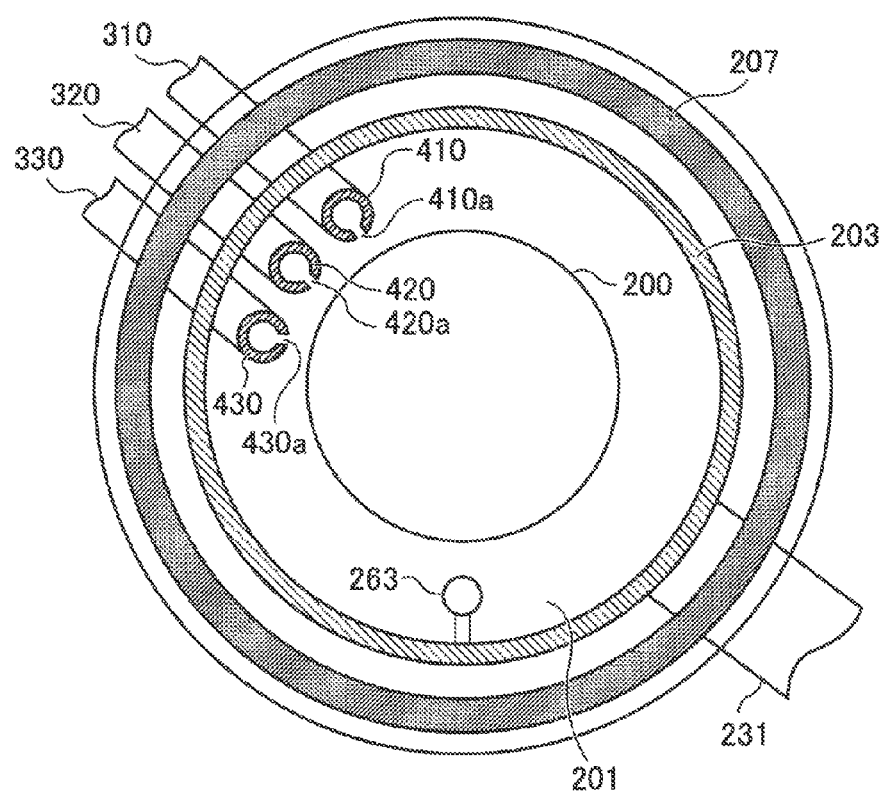
FIG. 2 is an A-A line cross section of FIG. 1.

As illustrated in FIG. 1, a processing furnace 202 has a heater 207 as a heating means (heating mechanism). The heater 207 has a cylindrical shape, and is vertically installed by being supported by a heater base as a holding plate (not illustrated).

Inside the heater 207, a reaction tube 203 is disposed that configures a reaction container (processing container) concentrically with the heater 207. The reaction tube 203 is made of heat-resistant material (for example, quartz ($SiO_2$) or silicon carbide (SiC)), and is formed in a cylindrical shape whose upper end is closed and lower end is opened. A processing chamber 201 is configured to be able to accommodate a wafer 200 as a substrate in a state of being aligned in multiple stages vertically in a horizontal position by a boat 217 described later.

Inside the processing chamber 201, nozzles 410, 420, 430 are provided to penetrate a side wall of a manifold 209. The nozzles 410, 420, 430 are connected to gas supply pipes 310, 320, 330 as gas supply lines respectively. In this way, the reaction tube 203 is provided with three nozzles 410, 420, 430 and three gas supply pipes 310, 320, 330, and is configured to be able to supply multiple types, here three types, of gas (processing gas, source) to the inside of the processing chamber 201.

However, the processing furnace 202 of the present embodiment is not limited to the embodiment described above. For example, a metal manifold can be provided for supporting the reaction tube 203 below the reaction tube 203, and each of the nozzles can be provided to penetrate the side wall of the manifold. In this case, an exhaust tube 231 described later can be further provided to the manifold. Even in this case, the exhaust tube 231 can be provided to the lower part of the reaction tube 203 instead of the manifold. In this way, a furnace port of the processing furnace 202 can be made of metal, and the nozzle and the like can be attached to the metal furnace port.

The gas supply pipes 310, 320, 330 are provided with mass flow controllers (MFC) 312, 322, 332 that are flow rate controllers (flow rate control units) and valves 314, 324, 334 that are on-off valves respectively in order from the upstream side. The downstream side of the valves 314, 324, 334 of the gas supply pipes 310, 320, 330 are connected to gas supply pipes 510, 520, 530 for supplying inert gas respectively. The gas supply pipes 510, 520, 530 are provided with MFCs 512, 522, 532 that are flow rate controllers (flow rate control units) and valves 514, 524, 534 that are on-off valves respectively in order from the upstream side.

The tips of the gas supply pipes 310, 320, 330 are coupled to the nozzles 410, 420, 430 respectively. The nozzles 410, 420, 430 are each configured as an L-shaped long nozzle, and their horizontal parts are provided to penetrate the side wall of the manifold 209. Vertical parts of the nozzles 410, 420, 430 are provided to stand up toward the upper side along an inner wall of the reaction tube 203 (upper side of loading direction of wafer 200) in an annular space formed between the inner wall of the reaction tube 203 and the wafer 200 (that is, to stand up from one end to the other end of wafer arrangement area). That is, the nozzles 410, 420, 430 are provided along the wafer arrangement area in an area that horizontally surrounds the wafer arrangement area of the side of the wafer arrangement area in which the wafer 200 is arranged.

Gas supply holes 410a, 420a, 430a for supplying (jetting) gas are provided to a side face of the nozzles 410, 420, 430 respectively. The gas supply holes 410a, 420a, 430a are opened to face a center of the reaction tube 203. The gas supply holes 410a, 420a, 430a each include multiple holes across from the lower part to the upper part of the reaction tube 203, and the multiple holes each has the same aperture area and further are provided at the same aperture pitch. However, the gas supply holes 410a, 420a, 430a are not limited to the embodiment described above. For example, the aperture area can be gradually increased from the lower part toward the upper part of the reaction tube 203. Thus, it is possible to equalize a flow rate of the gas supplied from the gas supply holes 410a, 420a, 430a.

In this way, a method of gas supply in the present embodiment conveys the gas in an annular vertically long space defined by the inner wall of the reaction tube 203 and an edge of the multiple wafers 200, that is, via the nozzles 410, 420, 430 disposed in the annular space. Then, the method jets the gas into the reaction tube 203 for the first time near the wafer 200 from the gas supply holes 410a, 420a, 430a respectively opened in the nozzles 410, 420, 430, and a main flow of the gas in the reaction tube 203 is set to a direction parallel to a surface of the wafer 200, that is, the horizontal direction. By such a configuration, it is possible to equally supply the gas to each wafer 200, and there is an effect that film thickness can be equalized of the thin film formed on each wafer 200. Incidentally, the gas that flows on the surface of each wafer 200, that is, the gas remaining after reaction (residual gas) flows toward an exhaust port, that is, a direction of the exhaust tube 231 described later; however, a direction of flow of the residual gas is appropriately specified by a position of the exhaust port, and is not limited to the vertical direction.

From the gas supply pipe 310, as the processing gas, inorganic source gas as first source gas (first source) containing a first element is supplied into the processing chamber 201 via the MFC 312, the valve 314, the nozzle 410. As the inorganic source gas, for example, metal source gas is used containing titanium (Ti) that is a metal element as the first element and not containing carbon (C), that is, titanium tetrachloride ($TiCl_4$) as halogen-based metal-containing gas (also referred to as metal halide, halogen-based metal source, halogen-based titanium-containing gas, halogen-based titanium source gas, halogen-based titanium source) that is inorganic metal source gas that is inorganic metal-containing gas (inorganic metal compound, inorganic titanium-containing gas, inorganic titanium source gas). Ti is classified as a transition metal element. A halogen-based source is a source containing a halogen group. The halogen group includes a chloro group, a fluoro group, a bromo group, an iodo group. That is, the halogen group includes halogen elements such as chlorine (Cl), fluorine (F), bromine (Br), iodine (I). When using the term "source" in the present specification, it may mean "a liquid source in a liquid state," "source gas in a gas state," or both.

From the gas supply pipe 320, as the processing gas, organic source gas as a second source gas containing the first element (second metal-containing gas, second source) is supplied into the processing chamber 201 via the MFC 322, the valve 324, the nozzle 420. As the organic source gas, for example, metal source gas is used containing Ti that is a metal element as the first element and containing C (C-containing), that is, tetrakis(diethylamino)titanium (Ti[$(C_2H_5)2N]_4$, abbreviation: TDEAT) as organic metal source gas (organic metal compound, organic titanium-containing gas, organic titanium source gas) that is organic metal-containing gas. Here, organic gas as an organic metal source has a broader sense than amine-based gas, and the amine-based gas is included in the organic gas. For example, cyclopentane ($C_5H_{10}$) is organic, however, is not amine-based.

From the gas supply pipe 330, as the processing gas, N-containing gas as a reaction gas (reactant) containing nitrogen (N) is supplied into the processing chamber 201 via the MFC 332, the valve 334, the nozzle 430. As the N-containing gas, it is possible to use metal element-free N-containing gas, for example, ammonia ($NH_3$) gas.

From the gas supply pipes 510, 520, 530, as the inert gas, for example, nitrogen ($N_2$) gas is supplied into the processing chamber 201 via the MFCs 512, 522, 532, the valves 514, 524, 534, the nozzles 410, 420, 430 respectively. The inert gas supplied from the gas supply pipes 510, 520, 530 acts as purge gas, dilution gas, or carrier gas in the substrate processing process described later.

When using a compound as the processing gas that is in a liquid state at normal temperature and pressure such as $TiCl_4$ and TDEAT, $TiCl_4$ and TDEAT in a liquid state are vaporized by a vaporization system such as a vaporizer and a bubbler, and supplied into the processing chamber 201 as $TiCl_4$ gas and TDEAT gas.

A processing gas supply system is configured mainly by the gas supply pipes 310, 320, 330, the MFCs 312, 322, 332, the valves 314, 324, 334. It may be considered by including the nozzles 410, 420, 430 in the processing gas supply system. The processing gas supply system can also be simply referred to as a gas supply system.

When the metal-containing gas as the source gas as described above flows from the gas supply pipes 310, 320, a metal-containing gas supply system as a source gas supply system is configured mainly by the gas supply pipes 310, 320, the MFCs 312, 322, the valves 314, 324. It may be considered by including the nozzles 410, 420 in the source gas supply system. The source gas supply system can also be referred to as a source supply system.

When the inorganic source gas as the source gas flows from the gas supply pipe 310, an inorganic source gas supply system is configured mainly by the gas supply pipe 310, the MFC 312, the valve 314. It may be considered by including the nozzle 410 in the inorganic source gas supply system (inorganic source supply system). When the inorganic metal source gas that is the inorganic metal-containing gas flows from the gas supply pipe 320, the inorganic source gas supply system can also be referred to as an inorganic metal source gas supply system as an inorganic metal-containing gas supply system (inorganic metal source supply system). When the halogen-based metal-containing gas flows from the gas supply pipe 320, the inorganic metal source gas supply system can also be referred to as a halogen-based metal-containing gas supply system (halogen-based metal source gas supply system, halogen-based metal source supply system, halogen-based source gas supply system, halogen-based source supply system). When the $TiCl_4$ gas as the halogen-based metal source gas flows from the gas supply pipe 310, the halogen-based metal source gas supply system can also be referred to as a $TiCl_4$ gas supply system. The $TiCl_4$ gas supply system can also be referred to as a $TiCl_4$ supply system.

When the organic source gas as the source gas flows from the gas supply pipe 320, an organic source gas supply system (organic source supply system) is configured mainly by the gas supply pipe 320, the MFC 322, the valve 324. It may be considered by including the nozzle 420 in the organic source gas supply system. When the organic metal source gas as the organic metal-containing gas flows from the gas supply pipe 320, the organic source gas supply system can also be referred to as an organic metal source gas supply system as an organic metal-containing gas supply system (organic metal source supply system). When the TDEAT gas as the organic metal-containing gas flows from the gas supply pipe 320, the organic metal source gas supply system can also be referred to as a TDEAT gas supply system. The TDEAT gas supply system can also be referred to as a TDEAT supply system.

When the N-containing gas as the reaction gas flows from the gas supply pipe 330, an N-containing gas supply system as a reaction gas supply system is configured mainly by the gas supply pipe 330, the MFC 332, the valve 334. It may be considered by including the nozzle 430 in the N-containing gas supply system. When $NH_3$ gas as the N-containing gas flows from the gas supply pipe 330, the reaction gas supply system can also be referred to as an $NH_3$ gas supply system. The $NH_3$ gas supply system can also be referred to as an $NH_3$ supply system.

In addition, an inert gas supply system is configured mainly by the gas supply pipes 510, 520, 530, the MFCs 512, 522, 532, the valves 514, 524, 534. The inert gas supply system can also be referred to as a carrier gas supply system. The inert gas also acts as purge gas, so that the inert gas supply system can also be referred to as a purge gas supply system.

The reaction tube 203 is provided with the exhaust tube 231 for exhausting an atmosphere in the processing chamber 201. The exhaust tube 231 is connected to a vacuum pump 246 as a vacuum exhaust apparatus via a pressure sensor 245 as a pressure detector (pressure detecting unit) for detecting pressure in the processing chamber 201 and an APC (Auto Pressure Controller) valve 244 as a pressure regulator (pressure regulating unit). The APC valve 244 is a valve configured to be able to perform vacuum exhaust and vacuum exhaust stop in the processing chamber 201 by opening and closing the valve in a state of operating the vacuum pump 246, and further, to be able to regulate the pressure in the processing chamber 201 by adjusting the valve opening based on pressure information detected by the pressure sensor 245 in a state of operating the vacuum pump 246. An exhaust system is configured mainly by the exhaust tube 231, the APC valve 244, the pressure sensor 245. It may be considered by including the vacuum pump 246 in the exhaust system.

Below the lower reaction tube 203, a seal cap 219 is provided as a furnace port lid capable of airtight closure of a lower end opening of the reaction tube 203. The seal cap 219 is configured to be in contact with the lower end of the reaction tube 203 from the vertical direction lower side. The seal cap 219 is made of metal such as SUS, and is formed in a disk shape. On the upper face of the seal cap 219, an O-ring 220 is provided as a seal member that is in contact with the lower end of the reaction tube 203. In the opposite side to the processing chamber 201 of the seal cap 219, a rotation mechanism 267 is installed for rotating the boat 217 described later. A rotation shaft 255 of the rotation mechanism 267 is connected to the boat 217 by penetrating the seal cap 219. The rotation mechanism 267 is configured to rotate the wafer 200 by rotating the boat 217. The seal cap 219 is configured to be elevated in the vertical direction by a boat elevator 115 as an elevation mechanism vertically installed outside the reaction tube 203. The boat elevator 115 is configured to be able to carry the boat 217 in and out to the inside and outside of the processing chamber 201 by elevating the seal cap 219. That is, the boat elevator 115 is configured as a conveyance apparatus (conveyance mechanism) for conveying the boat 217, that is, wafer 200 to the inside and outside of the processing chamber 201.

The boat 217 as a substrate support member is configured to support multiple, for example 25 to 200 of wafers 200 in multiple stages by vertically aligning in the horizontal position and in a state in which each center is aligned, that is, to align with an interval. The boat 217 is made of heat-resistant material such as quartz and SiC. In the lower part of the boat 217, a heat insulation plate 218 made of the heat-resistant material such as quartz and SiC is supported in multiple stages in the horizontal position. With this configuration, heat from the heater 207 is not easily transmitted to the seal cap 219 side. However, the present embodiment is not limited to the embodiment described above. For example, without providing the heat insulation plate 218 to the lower part of the boat 217, a heat insulation cylinder can be provided that is configured as a cylindrical member made of the heat-resistant material such as quartz and SiC.

In the reaction tube 203, a temperature sensor 263 as a temperature detector is installed, and is configured so that temperature distribution in the processing chamber 201 becomes a desired temperature distribution by regulating an amount of electrification to the heater 207 based on temperature information detected by the temperature sensor 263. The temperature sensor 263 is configured in L-shape similarly to the nozzles 410, 420 and 430, and is provided along the inner wall of the reaction tube 203.

Figure 3:
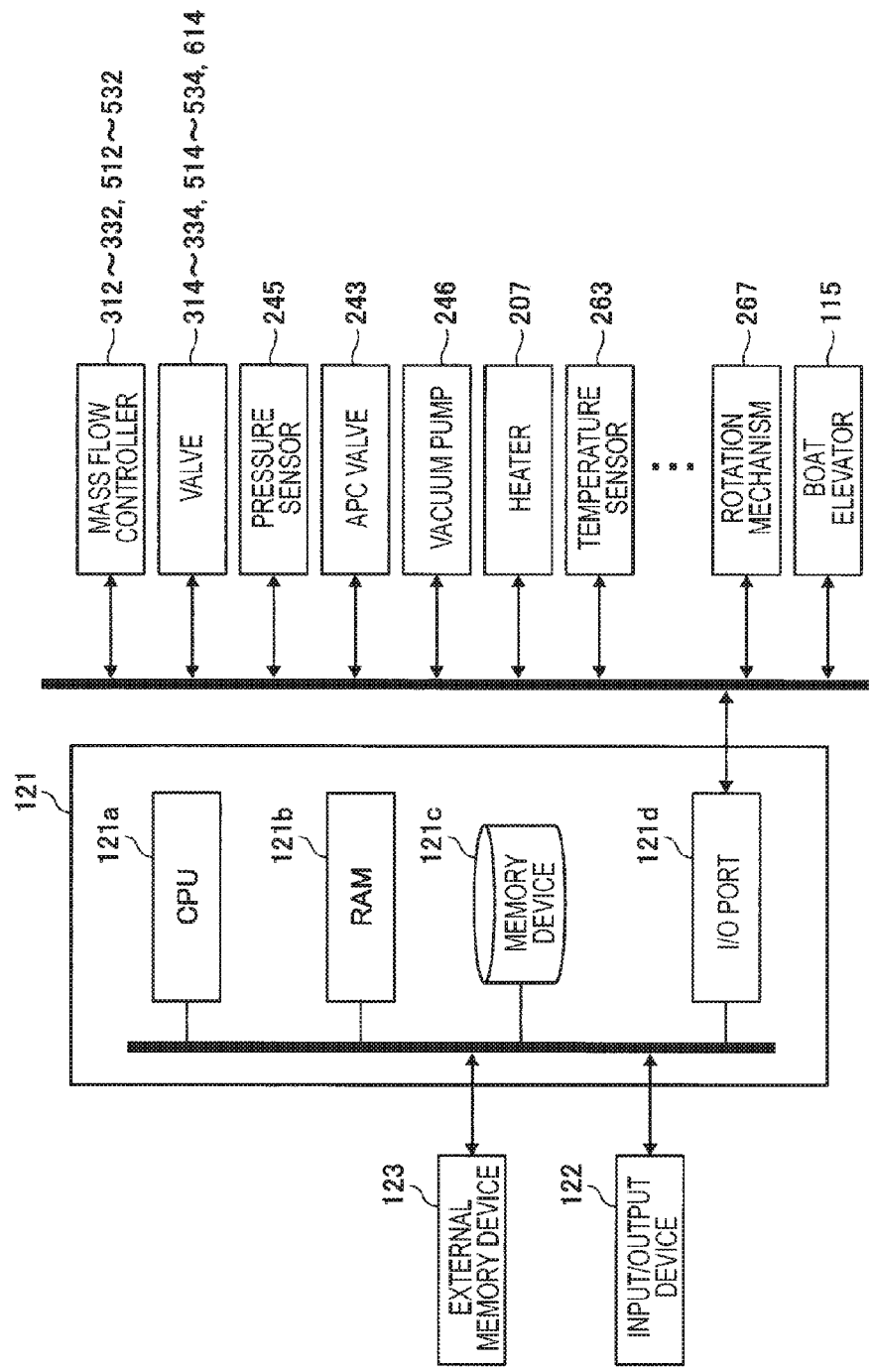
FIG. 3 is a block diagram illustrating a configuration of a controller included in the substrate processing apparatus illustrated in FIG. 1.

As illustrated in FIG. 3, a controller 121 that is a control unit (control means) is configured as a computer including a CPU (Central Processing Unit) 121a, RAM (Random Access Memory) 121b, a memory device 121c, an I/O port 121d. The RAM 121b, the memory device 121c, the I/O port 121d are configured to be capable of data exchange with the CPU 121a via an internal bus. The controller 121 is connected to an input/output device 122 configured as, for example, a touch panel.

The memory device 121c is configured by, for example, a flash memory, an HDD (Hard Disk Drive). The memory device 121c readably stores a control program for controlling operation of the substrate processing apparatus, a process recipe in which a procedure and a condition of substrate processing described later are described, and the like. The process recipe, in which procedures in the substrate processing process described later are combined to allow the controller 121 to execute to obtain a predetermined result, functions as a program. Hereinafter, the process recipe, the control program, and the like are also collectively referred to as, simply, a program. In the present specification, when using the term program, it may include the process recipe alone, the control program alone, or both. In addition, the RAM 121b is configured as a memory area (work area) in which the program, data, and the like read by the CPU 121a are temporarily stored.

The I/O port 121d is connected to the MFCs 312, 322, 332, 512, 522, 532, the valves 314, 324, 334, 514, 524, 534, the APC valve 243, the pressure sensor 245, the vacuum pump 246, the heater 207, the temperature sensor 263, the rotation mechanism 267, the boat elevator 115, and the like described above.

The CPU 121a is configured to read the control program from the memory device 121c to execute, and to read the process recipe from the memory device 121c depending on input of an operation command from the input/output device 122 and the like. The CPU 121a is configured to control: flow rate regulating operation of various types of gas by the MFCs 312, 322, 332, 512, 522, 532; on-off operation of the valves 314, 324, 334, 514, 524, 534; on-off operation of the APC valve 243 and pressure regulating operation based on the pressure sensor 245 by the APC valve 243; temperature regulating operation of the heater 207 based on the temperature sensor 263; start and stop of the vacuum pump 246; rotation and rotation rate adjusting operation of the boat 217 by the rotation mechanism 267; elevating operation of the boat 217 by the boat elevator 115; and the like, according to the process recipe read.

The controller 121 can be configured by installing the program described above stored in an external memory device (for example, magnetic tape, magnetic disk such as flexible disk and hard disk, optical disk such as CD and DVD, magneto-optical disk such as MO, semiconductor memory such as USB memory and memory card) 123 to the computer. The memory device 121c and the external memory device 123 are configured as computer readable recording media. Hereinafter, these are also collectively referred to as, simply, recording media. When using the term recording media in the present specification, it may include the memory device 121c alone, the external memory device 123 alone, or both. Incidentally, the program can be provided to the computer by using communication means such as Internet and a dedicated line without using the external memory device 123.

(2) Substrate Processing Process (Film-Forming Process)

Figure 4:
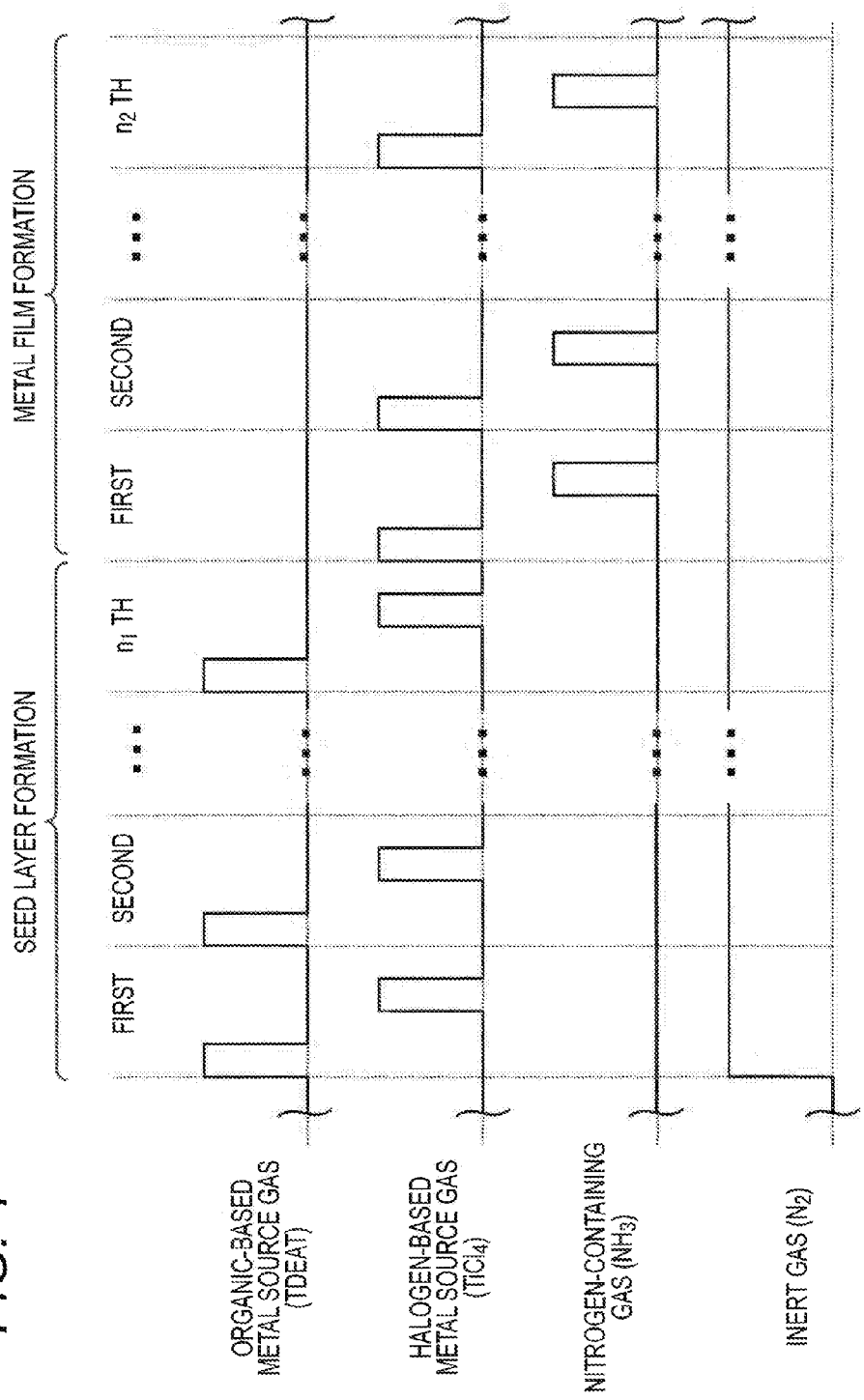
FIG. 4 is a diagram illustrating a sequence in a first embodiment of the present invention.

As one process of the method of manufacturing the semiconductor device (device), one example is described for forming a metal nitride film that configures, for example, a gate electrode and a capacitor electrode on the substrate with reference to FIG. 4. Forming the metal nitride film is executed using the processing furnace 202 of the substrate processing apparatus 10 described above. In the following description, operation of each part that configures the substrate processing apparatus 10 is controlled by the controller 121.

A suitable film-forming sequence (also simply referred to as sequence) of the present embodiment includes: forming a seed layer (for example, titanium film (Ti film)) on a wafer 200 by performing a first process and a second process in a time-division manner a predetermined number of times, the first process supplying organic metal-containing gas (for example, TDEAT gas) containing a metal element (for example, Ti) to the wafer 200, the second process supplying inorganic metal-containing gas (for example, $TiCl_4$ gas) containing the metal element to the wafer 200; and forming a metal-containing nitride film (for example, titanium nitride film (TiN film)), to the substrate on which the seed layer is exposed, on the seed layer by performing a third process and a fourth process in a time-division manner a predetermined number of times, the third process supplying and exhausting the inorganic metal-containing gas to the substrate, the fourth process supplying and exhausting nitrogen-containing gas to the substrate.

Specifically, as illustrated in FIG. 4, the sequence includes: forming the Ti film by performing supplying the TDEAT gas and supplying the $TiCl_4$ gas in a time-division manner a predetermined number of times ($n_1$ times); and forming the TiN film on the Ti film by performing supplying the $TiCl_4$ gas and supplying $NH_3$ gas in a time-division manner a predetermined number of times ($n_2$ times).

In the present specification, "performing processing (or referred to as process, cycle, step, or the like) a predetermined number of times" means that performing the processing once or a plurality of times. That is, it means that performing the processing at least once. FIG. 4 illustrates an example of repeating each processing (cycle) $n_1$ cycles, $n_2$ cycles. Values of $n_1$, $n_2$ are appropriately selected depending on film thickness to be required for the Ti film, the TiN film to be finally formed. That is, the number of times of performing the processing described above is determined depending on the film thickness to be targeted.

Incidentally, in the present specification, when using the term "a wafer," it may mean "a wafer itself," or "a laminated body (aggregated body) of the wafer and a predetermined layer, film, or the like formed on the surface of the wafer," (that is, it may referred to as wafer including the predetermined layer, film, or the like formed on the surface of the wafer). In addition, in the present specification, when using the term "a surface of the wafer," it may mean "a surface of the wafer itself (exposed surface)," or "a surface of a predetermined layer, film, or the like formed on the wafer, that is, an outermost surface of the wafer as the laminated body."

Therefore, in the present specification, when described as "supply the predetermined gas to the wafer," it may mean that "directly supply the predetermined gas to the surface of the wafer itself (exposed surface)," or it may mean that "supply the predetermined gas to the layer, film, or the like formed on the wafer, that is, to the outermost surface of the wafer as the laminated body." In the present specification, when described as "form the predetermined layer (or film) on the wafer," it may mean that "directly form the predetermined layer (or film) on the surface of the wafer itself (exposed surface)," or it may mean that "form the predetermined layer (or film) on the layer, film, or the like formed on the wafer, that is, on the outermost surface of the wafer as the laminated body."

Incidentally, in the present specification, even when using the term "substrate," it is the same when using the term "wafer," and in that case, it can be considered by replacing the "wafer" with the "substrate" in the above description.

In the present specification, the term metal film means a film composed of a conductive substance including a metal atom, and the metal film includes a conductive metal nitride film, conductive metal oxide film, conductive metal oxynitride film, conductive metal composite film, conductive metal alloy film, conductive metal silicide film, conductive metal carbide film, conductive metal carbonitride film. Incidentally, a Ti film is a conductive metal film and is an elemental metal film; a TiN film is a conductive metal film and is a metal nitride film.

(Wafer Charge and Boat Load)

When multiple wafers 200 are charged to the boat 217 (wafer charge), as illustrated in FIG. 1, the boat 217 that supports the multiple wafers 200 is lifted by the boat elevator 115 to be loaded into the processing chamber 201 (boat load). In this state, the seal cap 219 turns to a state of closing a lower end opening of the manifold 209 via the O-ring 220.

(Pressure Regulation and Temperature Regulation)

Vacuum exhaust is performed by the vacuum pump 246 so that the space in the processing chamber 201, that is, the space in which the wafer 200 exists, may be in a desired pressure (degree of vacuum). At this time, the pressure in the processing chamber 201 is measured by the pressure sensor 245, and based on the pressure information measured, feedback control (pressure regulation) is performed of the APC valve 243. The vacuum pump 246 always maintains a state of being operated at least until the processing to the wafer 200 is completed. In addition, heating is performed by the heater 207 so that the processing chamber 201 may be at a desired temperature. At this time, feedback control (temperature regulation) is performed of an amount of electrification to the heater 207 based on the temperature information detected by the temperature sensor 263 so that the processing chamber 201 may be in a desired temperature distribution. The heating by the heater 207 in the processing chamber 201 is continuously performed at least until the processing to the wafer 200 is completed. Subsequently, rotation of the boat 217 and the wafer 200 is started by the rotation mechanism 267. The rotation of the boat 217 and the wafer 200 by the rotation mechanism 267 is continuously performed at least until the processing to the wafer 200 is completed.

(Seed Layer Formation Step)

Subsequently, a step for forming a Ti layer is executed that is used as the seed layer that is a low nuclear density film. A seed layer formation step includes an organic metal-containing gas supply step, a residual gas removal step, a halogen-based metal-containing gas supply step, a residual gas removal step that are described below.

(Organic Metal-Containing Gas Supply Step)

The valve 324 is opened, and then the TDEAT gas that is the organic metal-containing gas flows into the gas supply pipe 320. A flow rate of the TDEAT gas that flows in the gas supply pipe 320 is regulated by the MFC 322. The TDEAT gas whose flow rate is regulated is supplied into the processing chamber 201 from the gas supply hole 420a of the nozzle 420, and then exhausted from the exhaust tube 231. At this time, the TDEAT gas is supplied to the wafer 200. That is, the surface of the wafer 200 is exposed to the TDEAT gas. At this time, the valve 524 is opened simultaneously, and then $N_2$ gas flows into the gas supply pipe 520. A flow rate of the $N_2$ gas that flows in the gas supply pipe 520 is regulated by the MFC 522. The $N_2$ gas whose flow rate is regulated is supplied into the processing chamber 201 with the TDEAT gas, and then exhausted from the exhaust tube 231. Incidentally, at this time, to prevent entering of the TDEAT gas into the nozzles 410, 430, the valves 514, 534 are opened, and then the $N_2$ gas flows into the gas supply pipes 510, 530. The $N_2$ gas is supplied into the processing chamber 201 via the gas supply pipe 310, gas supply pipe 330, nozzles 410, 430, and then exhausted from the exhaust tube 231.

At this time, a pressure in the processing chamber 201 is appropriately regulated by the APC valve 243 to, for example, a (predetermined) pressure in a range of 1 to 10000 Pa, preferably a (predetermined) pressure in a range of 1 to 500 Pa, more preferably a (predetermined) pressure in a range of 40 to 60 Pa. When the pressure is higher than 10,000 Pa, the residual gas removing described later may not be sufficiently performed, and when the pressure is lower than 1 Pa, a reaction rate of the TDEAT gas may not be sufficiently obtained. Incidentally, in the present specification, as a range of the numerical value, when described as, for example, 1 to 10,000 Pa, it means that it is equal to or greater than 1 Pa and equal to or less than 10,000 Pa. That is, in the range of the numerical value, 1 Pa and 10,000 Pa are included. Not only for the pressure, but also for the flow rate, the time, the temperature, and the like, it is the same for all numerical values described in the present specification.

A supply flow rate of the TDEAT gas is controlled by the MFC 322 to, for example, a (predetermined) flow rate in a range of 1 to 10,000 sccm, preferably a (predetermined) flow rate in a range of 1 to 1,000 sccm, more preferably a (predetermined) flow rate in a range of 1 to 100 sccm. When the flow rate is greater than 10,000 sccm, the residual gas removing described later may not be sufficiently performed, and when the flow rate is less than 1 sccm, the reaction rate of the TDEAT gas may not be sufficiently obtained.

A supply flow rate of the $N_2$ gas is controlled by each of the MFCs 512, 522, 532 to, for example, a (predetermined) flow rate in a range of 10 to 20,000 sccm, preferably a (predetermined) flow rate in a range of 400 to 15,000 sccm, more preferably a (predetermined) flow rate in a range of 300 to 600 sccm. When the flow rate is greater than 20,000 sccm, the reaction rate of the TDEAT gas may not be sufficiently obtained, and when the flow rate is less than 10 sccm, the residual gas removing described later may not be sufficiently performed.

Time for supplying the TDEAT gas to the wafer 200, that is, gas supply time (exposure time) is, for example, (predetermined) time in a range of 0.1 to 120 s, preferably (predetermined) time in a range of 0.5 to 30 s, more preferably (predetermined) time in a range of 8 to 12 s. When the supply time is longer than 60 s, an organic matter such as C, N and amine, and the like may be taken a lot, and when the supply time is shorter than 0.1 s, the deposition rate may be decreased.

A temperature of the heater 207 is set so that a temperature of the wafer 200 becomes, for example, a (predetermined) temperature in a range of 200 to 600° C., preferably a (predetermined) temperature in a range of 250 to 550° C., more preferably a (predetermined) temperature in a range of 360 to 400° C. When the temperature is equal to or higher than 600° C., thermal decomposition of the TDEAT gas is accelerated, so that there is a case in which the deposition rate becomes too high and uniformity of film thickness is deteriorated by deterioration of controllability, or impurities are taken a lot and resistivity is increased. In contrast, when the temperature is lower than 200° C., reactivity is decreased and film-forming may be difficult. Only the TDEAT gas and $N_2$ gas flow into the processing chamber 201, and by supply of the TDEAT gas, a first Ti-containing layer is formed on the wafer 200 (base film of surface, here, first TiN film).

The Ti-containing layer formed in an organic metal-containing gas formation step may be a Ti layer containing only Ti single atom, and may contain the other atom from each source, and, in an organic metal-containing gas supply step that uses the TDEAT gas, may contain an organic matter such as C, N and amine. Therefore, the Ti-containing layer contains a TDEAT layer that is an adsorption layer of TDEAT. The TDEAT layer, other than a contiguous adsorption layer of a TDEAT molecule, also contains a noncontiguous adsorption layer. That is, the TDEAT layer contains an adsorption layer whose thickness is equal to one molecule layer or less than one molecule layer composed of the TDEAT molecule. The TDEAT molecule that composes the TDEAT layer contains the one in which bonds of C, N, H are partially broken.

(Residual Gas Removal Step)

After that, the valve 324 is closed to stop the supply of the TDEAT gas. At this time, the APC valve 243 of the exhaust tube 231 is kept being opened, and the inside of the processing chamber 201 is vacuum-exhausted by the vacuum pump 246 to exclude the TDEAT gas unreacted remaining in the processing chamber 201 from the inside of the processing chamber 201. Incidentally, at this time, the valves 514, 524, 534 are kept being opened to maintain the supply of the $N_2$ gas into the processing chamber 201. The $N_2$ gas acts as the purge gas; thus, it is possible to enhance the effect of excluding the TDEAT gas remaining in the processing chamber 201 from the inside of the processing chamber 201.

At this time, the gas remaining in the processing chamber 201 need not be completely excluded, and the inside of the processing chamber 201 need not be completely purged. When the amount of the gas remaining in the processing chamber 201 is very small, a subsequent step is not adversely affected. The flow rate of the $N_2$ gas to be supplied into the processing chamber 201 need not be a large flow rate; for example, by supplying an amount of about the same volume of the reaction tube 203 (processing chamber 201), it is possible to perform the purge that does not adversely affect the subsequent step. In this way, the inside of the processing chamber 201 is not completely purged, so that it is possible to shorten purge time, and to increase the throughput. It is also possible to suppress the consumption of the $N_2$ gas to a minimum requirement.

(Halogen-Based Metal-Containing Gas Supply Step)

The valve 314 is opened, and then the $TiCl_4$ gas that is the halogen-based metal-containing gas flows into the gas supply pipe 310. A flow rate of the $TiCl_4$ gas that flows in the gas supply pipe 310 is regulated by the MFC 312. The $TiCl_4$ gas whose flow rate is regulated is supplied into the processing chamber 201 from the gas supply hole 410a of the nozzle 410, and then exhausted from the exhaust tube 231. At this time, the $TiCl_4$ gas is supplied to the wafer 200. That is, the surface of the wafer 200 is exposed to the $TiCl_4$ gas. At this time, the valve 514 is opened simultaneously, and then the inert gas such as the $N_2$ gas flows into the gas supply pipe 510. A flow rate of the $N_2$ gas that flows in the gas supply pipe 510 is regulated by the MFC 512. The $N_2$ gas whose flow rate is regulated is supplied into the processing chamber 201 with the $TiCl_4$ gas, and then exhausted from the exhaust tube 231. Incidentally, at this time, to prevent entering of the $TiCl_4$ gas into the nozzles 420, 430, the valves 524, 534 are opened, and then the $N_2$ gas flows into the gas supply pipe 520, gas supply pipe 530. The $N_2$ gas is supplied into the processing chamber 201 via the gas supply pipe 320, gas supply pipes 330, 420, 430, and then exhausted from the exhaust tube 231.

At this time, a pressure in the processing chamber 201 is appropriately regulated by the APC valve 243 to, for example, a (predetermined) pressure in a range of 1 to 70,000 Pa, preferably a (predetermined) pressure in a range of 1 to 1333 Pa, more preferably a (predetermined) pressure in a range of 20 to 50 Pa. When the pressure is higher than 70,000 Pa, the residual gas removing described later may not be sufficiently performed, and when the pressure is lower than 0.01 Pa, a reaction rate of the $TiCl_4$ gas may not be sufficiently obtained.

A supply flow rate of the $TiCl_4$ gas is controlled by the MFC 312 to, for example, a (predetermined) flow rate in a range of 1 to 10,000 sccm, preferably a (predetermined) flow rate in a range of 150 to 2,000 sccm, more preferably a (predetermined) flow rate in a range of 300 to 600 sccm. When the flow rate is greater than 10,000 sccm, the residual gas removing described later may not be sufficiently performed, and when the flow rate is less than 1 sccm, the reaction rate of the $TiCl_4$ gas may not be sufficiently obtained.

A supply flow rate of the $N_2$ gas is controlled by each of the MFCs 512, 522, 532 to, for example, a (predetermined) flow rate in a range of 1-20000 sccm, preferably a (predetermined) flow rate in a range of 500 to 15,000 sccm, more preferably a (predetermined) flow rate in a range of 600 to 800 sccm. When the flow rate is greater than 20,000 sccm, the reaction rate of the $TiCl_4$ gas may not be sufficiently obtained, and when the flow rate is less than 1 sccm, the residual gas removing described later may not be sufficiently performed.

Time for supplying the $TiCl_4$ gas to the wafer 200, that is, gas supply time (exposure time) is, for example, (predetermined) time in a range of 0.1 to 120 s, preferably (predetermined) time in a range of 1 to 30 s, more preferably (predetermined) time in a range of 2 to 4 s. When the supply time is longer than 120 s, Cl and the like may be taken a lot, and when the supply time is shorter than 0.1 s, the deposition rate may be decreased.

The temperature of the heater 207 is set to the same temperature of the organic metal-containing gas supply step. Only the $TiCl_4$ gas and the $N_2$ gas flow into the processing chamber 201, and by supply of the $TiCl_4$ gas, at least a part of the first Ti-containing layer formed on the wafer 200 (base film of surface) and the $TiCl_4$ gas react to each other (substitution reaction), and then the Ti layer is formed as the seed layer.

A main constituent element of the Ti layer formed in the halogen-based metal-containing gas supply step is Ti, and it may be the Ti layer containing only the Ti single atom, and may contain the other atom from each source. That is, there is a case in which C, N, H are contained in the first Ti-containing layer formed in the organic metal-containing gas supply step, and C, N, H to which the substitution reaction to the $TiCl_4$ gas has not caused in the halogen-based metal-containing gas supply step remain and become the constituents of the Ti layer, and there is a case in which Cl is taken in the halogen-based metal-containing gas supply step and becomes the constituent of the Ti layer. In this way, the Ti layer is formed by performing the organic metal-containing gas supply step that uses the organic metal-containing gas including a ligand containing C, N, H that are larger ligand than the ligand included in the halogen-based metal-containing gas, so that the ligand containing C, N, H is taken to the Ti layer, and the deposition rate is increased, and it is possible to form the Ti layer as the film having a large grain size, that is, the low nuclear density film. Incidentally, the main constituent element of the Ti layer is Ti; however, the ti layer may contain the other atom from each source, so that it can also be referred to as TiN layer, TiC layer, TiCN layer, and the like.

(Residual Gas Removal Step)

After forming the Ti layer, the valve 314 is closed to stop the supply of the $TiCl_4$ gas. Then, by the processing procedure same as the residual gas removal step after the organic metal-containing gas supply step, the $TiCl_4$ gas is excluded from the inside of the processing chamber 201, being unreacted or after contributing the formation of the Ti layer and remaining in the processing chamber 201, the space in which the wafer 200 after forming the Ti layer exists. At this time, a point that the gas remaining in the processing chamber 201 need not be completely excluded is the same as the residual gas removal step after the organic metal-containing gas supply step.

(Predetermined Number of Times Implementation)

By performing a cycle at least once (predetermined number of times), the cycle performing the organic metal-containing gas supply step, the residual gas removal step, the halogen-based metal-containing gas supply step, the residual gas removal step described above in order in a time-division manner, that is, where processing of the organic metal-containing gas supply step, the residual gas removal step, the halogen-based metal-containing gas supply step, the residual gas removal step is one cycle, by executing the processing $n_1$ cycles ($n_1$ is an integer equal to or greater than 1), the Ti layer is formed as a low nuclear density seed layer on the wafer 200. The cycle described above, although the purpose may be sufficiently achieved by one execution, can repeat multiple times.

When performing the cycle multiple times, in at least second cycle and subsequent steps, a part described as "supply the predetermined gas to the wafer 200," means that "supply the predetermined gas to the layer formed on the wafer 200, that is, to the outermost surface of the wafer 200 as the laminated body," and a part described as "form the predetermined layer on the wafer 200," means that "form the predetermined layer on the layer formed on the wafer 200, that is, on the outermost surface of the wafer 200 as the laminated body." This point is the same in the example described later.

(Metal Nitride Film Formation Step)

Subsequently, a step is executed for forming a metal nitride film (TiN film) on the seed layer (Ti layer) formed in the steps described above. A metal nitride film formation step includes a halogen-based metal-containing gas supply step, a residual gas supply step, an N-containing gas supply step, a residual gas supply step that are described below.

(Halogen-Based Metal-Containing Gas Supply Step)

By the same processing procedure and processing condition as the halogen-based metal-containing gas supply step described above, the $TiCl_4$ gas used as the halogen-based metal-containing gas is supplied into the processing chamber 201. At this time, only the $TiCl_4$ gas and the $N_2$ gas flow into the processing chamber 201, and by the supply of the $TiCl_4$ gas, a second Ti-containing layer is formed on the wafer 200. In the first cycle of the halogen-based metal-containing gas supply step, the second Ti-containing layer is directly formed on the seed layer. The second Ti-containing layer can be an elemental Ti layer made of Ti alone, and can be a Ti layer containing Cl, and can be an adsorption layer of $TiCl_4$, and can be a composite layer thereof.

The Ti layer containing Cl is a general term including, other than a contiguous layer that is composed of Ti and contains Cl, a noncontiguous layer, and also a Ti thin film containing Cl composed of the contiguous and noncontiguous layers overlapped with each other. The contiguous layer that is composed of Ti and contains Cl may be referred to as a Ti thin film containing Cl. Ti that composes the Ti layer containing Cl includes, other than the one in which the bond with Cl is not completely broken, the one in which the bond with Cl is completely broken.

The adsorption layer of $TiCl_4$ includes, other than a contiguous adsorption layer composed of a $TiCl_4$ molecule, also a noncontiguous adsorption layer. That is, the adsorption layer of $TiCl_4$ includes the adsorption layer whose thickness is equal to one molecule layer or less than one molecule layer composed of the $TiCl_4$ molecule. The $TiCl_4$ molecule composing the adsorption layer of $TiCl_4$ includes the one in which bonds between Ti and Cl are partially broken. That is, the adsorption layer of $TiCl_4$ can be a physical adsorption layer of $TiCl_4$, and can be a chemical adsorption layer of $TiCl_4$, and can include both thereof.

(Residual Gas Removal Step)

Subsequently, by the processing same as the residual gas supply step after the halogen-based metal-containing gas supply step described above, the $TiCl_4$ gas remaining in the processing chamber 201 is excluded from the inside of the processing chamber 201.

(N-Containing Gas Supply Step)

After removing the residual gas in the processing chamber 201, the valve 334 is opened, and then the $NH_3$ gas that is N-containing gas flows into the gas supply pipe 330. A flow rate of the $NH_3$ gas that flows in the gas supply pipe 330 is regulated by the MFC 332. The $NH_3$ gas whose flow rate is regulated is supplied into the processing chamber 201 from the gas supply hole 430a of the nozzle 430. The $NH_3$ gas supplied into the processing chamber 201 is activated by heat, and then exhausted from the exhaust tube 231. At this time, the $NH_3$ gas activated by heat is supplied to the wafer 200. That is, the surface of the wafer 200 is exposed to the $NH_3$ gas activated by heat. At this time, the valve 534 is opened simultaneously, and then $N_2$ gas flows into the gas supply pipe 530. A flow rate of the $N_2$ gas that flows in the gas supply pipe 530 is regulated by the MFC 532. The $N_2$ gas is supplied into the processing chamber 201 with the $NH_3$ gas, and then exhausted from the exhaust tube 231. At this time, to prevent entering of the $NH_3$ gas into the nozzles 410, 420, the valves 514, 524 are opened, and then the $N_2$ gas flows into the gas supply pipes 510, 520. The $N_2$ gas is supplied into the processing chamber 201 via the gas supply pipes 310, 320, nozzles 410, 420, and then exhausted from the exhaust tube 231.

When the $NH_3$ gas flows, a pressure in the processing chamber 201 is appropriately regulated by the APC valve 243 to, for example, a (predetermined) pressure in a range of 0.01 to 70,000 Pa, preferably a (predetermined) pressure in a range of 1 to 1,330 Pa, more preferably a (predetermined) pressure in a range of 50 to 100 Pa. When the pressure is higher than 70,000 Pa, the residual gas removing described later may not be sufficiently performed, and when the pressure is lower than 0.01 Pa, a sufficient deposition rate may not be obtained.

A supply flow rate of the $NH_3$ gas is controlled by the MFC 332 to, for example, a (predetermined) flow rate in a range of 10 to 50,000 sccm, preferably a (predetermined) flow rate in a range of 300 to 10,000 sccm, more preferably a (predetermined) flow rate in a range of 1,000 to 8,000 sccm. Although a greater flow rate is preferable since it is possible to decrease taking of impurities derived from the source gas into the TiN film, when the flow rate is greater than 50,000 sccm, in the residual gas removal step described later, the residual gas may not be sufficiently removed. When the flow rate is less than 0.1 slm, sufficient reaction may not be possible.

A flow rate of the $N_2$ gas is controlled by each of the MFCs 512, 522, 532 to, for example, a (predetermined) flow rate in a range of 10 to 20,000 sccm, preferably a (predetermined) flow rate in a range of 400 to 15,000 sccm, more preferably a (predetermined) flow rate in a range of 400 to 7,500 sccm. When the flow rate is greater than 20,000 sccm, the deposition rate may be excessively decreased, and when the flow rate is less than 10 sccm, the $NH_3$ gas may not be sufficiently supplied to the wafer 200.

Time for supplying the $NH_3$ gas to the wafer 200, that is, gas supply time (exposure time) is, for example, (predetermined) time in a range of 0.001 to 300 s, preferably (predetermined) time in a range of 0.1 to 60 s, more preferably (predetermined) time in a range of 10 to 25 s. Although longer supply time is preferable since it is possible to decrease taking impurities derived from the source gas into the TiN film, when the time is longer than 300 s, the throughput may be decreased. When the supply time is shorter than 0.001 s, sufficient reaction with the $TiCl_4$ gas may not be possible.

The temperature of the heater 207 is set to the temperature same as the halogen-based metal-containing gas supply step.

At this time, only the $NH_3$ gas and the $N_2$ gas flow into the processing chamber 201. The $NH_3$ gas causes the substitution reaction to at least a part of the second Ti-containing layer formed on the wafer 200 in the halogen-based metal-containing gas supply step. In the substitution reaction, Ti contained in the Ti-containing layer and N contained in the $NH_3$ gas are bonded together, and the TiN layer containing Ti and N is formed on the wafer 200. In the first cycle, the TiN layer is directly formed on the low nuclear density seed layer (Ti layer). The TiN layer may contain Cl remaining without causing the substitution reaction to the $NH_3$ gas.

(Residual Gas Removal Step)

After forming the TiN layer, the valve 334 is closed to stop the supply of the $NH_3$ gas. Then, by the processing procedure same as the residual gas removal step after the halogen-based metal-containing gas supply step, the $NH_3$ gas, a reaction by-product, and the like are excluded from the processing chamber 201, the $NH_3$ gas being unreacted or after contributing the formation of the TiN layer and remaining in the processing chamber 201, that is, the space in which the wafer 200 after forming the TiN layer exists. At this time, a point that the gas remaining in the processing chamber 201 need not be completely excluded is the same as the residual gas removal step after the halogen-based metal-containing gas supply step.

(Predetermined Number of Times Implementation)

By performing a cycle at least once (predetermined number of times), the cycle performing the halogen-based metal-containing gas supply step, the residual gas supply step, the N-containing gas supply step, the residual gas supply step described above in order in a time-division manner, that is, where processing of the halogen-based metal-containing gas supply step, the residual gas supply step, the N-containing gas supply step, the residual gas supply step is one cycle, by executing the processing $n_2$ cycles ($n_2$ is an integer equal to or greater than one), the TiN film of a predetermined thickness (for example, 0.1 to 10 nm) is formed on the wafer 200. It is preferable to repeat the cycle described above multiple times. By directly forming the TiN layer on the Ti layer having a larger grain size than the TiN layer formed using only the halogen-based metal-containing gas as the metal-containing gas, the TiN layer is formed using the nucleus of the Ti layer previously formed as the seed, so that it is possible to increase the grain size of the TiN layer similarly to the grain size of Ti layer. That is, it is possible to decrease the nuclear density of the TiN layer. The grain size of the TiN layer formed in each cycle described above becomes the same size as the grain size of the base that is directly in contact with (is led by the grain size of the base), so that the TiN film formed by the above processing procedure becomes the film having the low nuclear density same as the Ti layer as the seed layer.

(Purge and Atmospheric Pressure Return)

The valves 514, 524, 534 are opened, and the $N_2$ gas is supplied into the processing chamber 201 from each of the gas supply pipes 510, 520, 530, and then exhausted from the exhaust tube 231. The $N_2$ gas acts as the purge gas; thus, the inside of the processing chamber 201 is purged by the inert gas, and the gas and by-product that remain in the processing chamber 201 are removed from the inside of the processing chamber 201 (purge). After that, an atmosphere in the processing chamber 201 is substituted by the inert gas (inert gas substitution), and the pressure in the processing chamber 201 is returned to the normal pressure (atmospheric pressure return).

(Boat Unload and Wafer Discharge)

After that, the seal cap 219 is lowered by the boat elevator 115, and the lower end of the reaction tube 203 is opened. Then, the wafer 200 processed is carried out to the outside of the reaction tube 203 from the lower end of the reaction tube 203 in a state of being supported by the boat 217 (boat unload). After that, the wafer 200 processed is taken out from the boat 217 (wafer discharge).

(3) Effect of the Present Embodiment

With the present embodiment, one or more effects set forth below are obtained.

(A) By forming the seed layer (Ti layer) whose nuclear density is lower than the normal metal film on the wafer 200, it is possible to increase the grain size of the metal film (TiN film) directly formed on the seed layer in comparison with the case of not forming the seed layer, and it is possible to provide the metal film capable of suppressing increase in resistivity of the metal film due to thinning in comparison with the case of not forming the seed layer. (B) When forming the seed layer, by forming the seed layer by supplying the organic metal-containing gas before the inorganic metal-containing gas (organic first), it is possible to improve surface roughness of the layer.

Second Embodiment of the Present Invention

In the first embodiment of the present invention, the example has been described of, in forming the seed layer, performing the organic metal-containing gas supply step and the halogen-based metal-containing gas supply step in order in a time-division manner a predetermined number of times. For a second embodiment, description is omitted for a part same as the first embodiment, and a different part from the first embodiment is described below.

Figure 5:
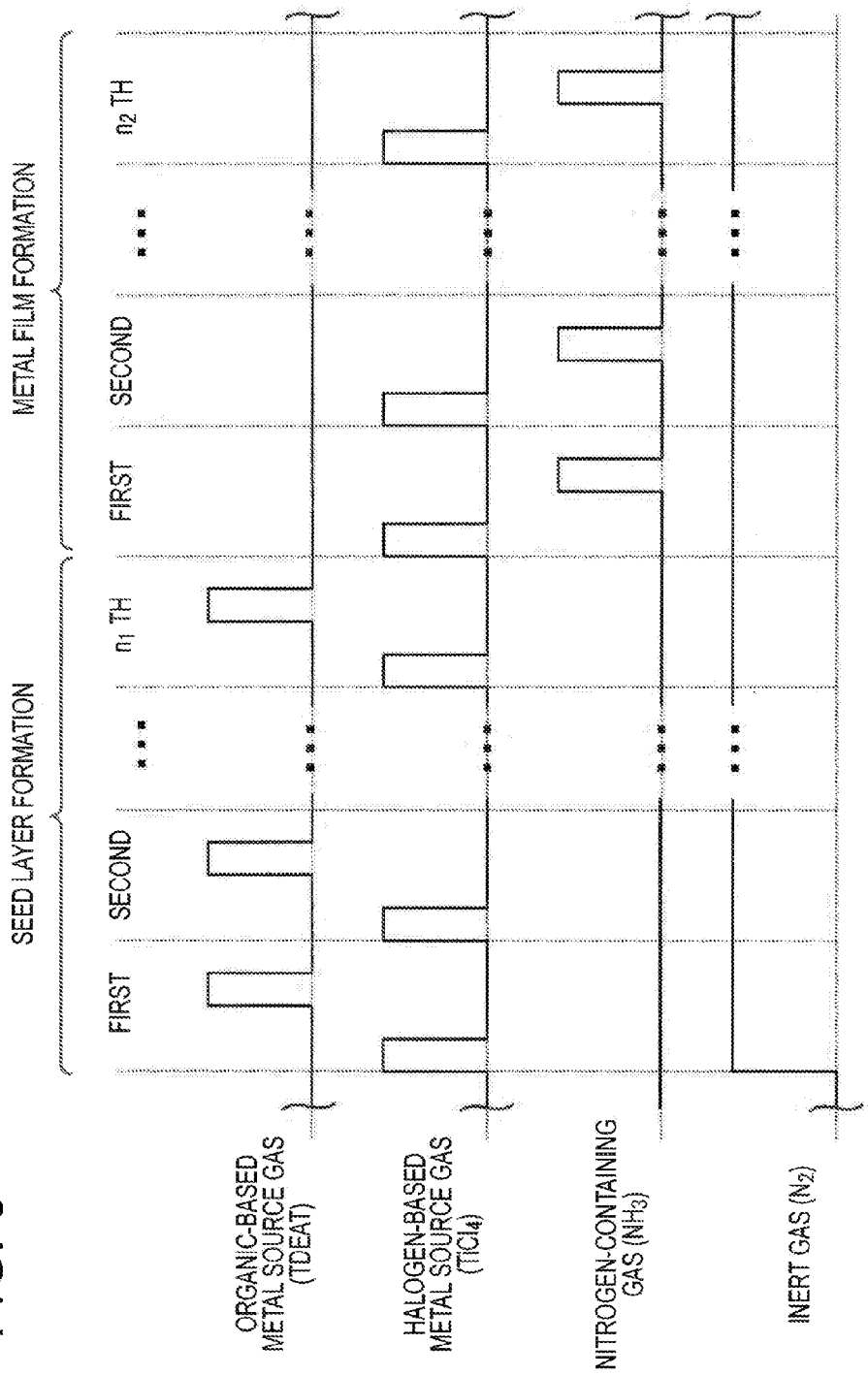
FIG. 5 is a diagram illustrating a sequence in a second embodiment of the present invention.

In contrast with the first embodiment, in the second embodiment, as illustrated in FIG. 5, in forming a seed layer, a halogen-based metal-containing gas supply step and an organic metal-containing gas supply step are performed in order in a time-division manner a predetermined number of times. More specifically, where processing of the halogen-based metal-containing gas supply step, a residual gas removal step, the organic metal-containing gas supply step, a residual gas removal step is one cycle, by executing the processing $n_1$ cycles ($n_1$ is an integer equal to or greater than 1), a low nuclear density seed layer (Ti layer) is formed on a wafer 200.

As described above, in the first embodiment, the halogen-based metal-containing gas supply step is performed after performing the organic metal-containing gas supply step; however, in the second embodiment, the organic metal-containing gas supply step is performed after performing the halogen-based metal-containing gas supply step.

With the present embodiment, an effect set forth below is obtained.

(A) By forming the seed layer (Ti layer) whose nuclear density is lower than the normal metal film on the wafer 200, it is possible to increase the grain size of the metal film (TiN film) directly formed on the seed layer in comparison with the case of not forming the seed layer, and it is possible to provide the metal film capable of suppressing increase in resistivity of the metal film due to thinning in comparison with the case of not forming the seed layer.

Third Embodiment of the Present Invention

In the first embodiment of the present invention, the example has been described of, in forming the seed layer, performing the organic metal-containing gas supply step and the halogen-based metal-containing gas supply step in order in a time-division manner a predetermined number of times. For a third embodiment, description is omitted for a part same as the first embodiment, and a different part from the first embodiment is described below.

Figure 6:
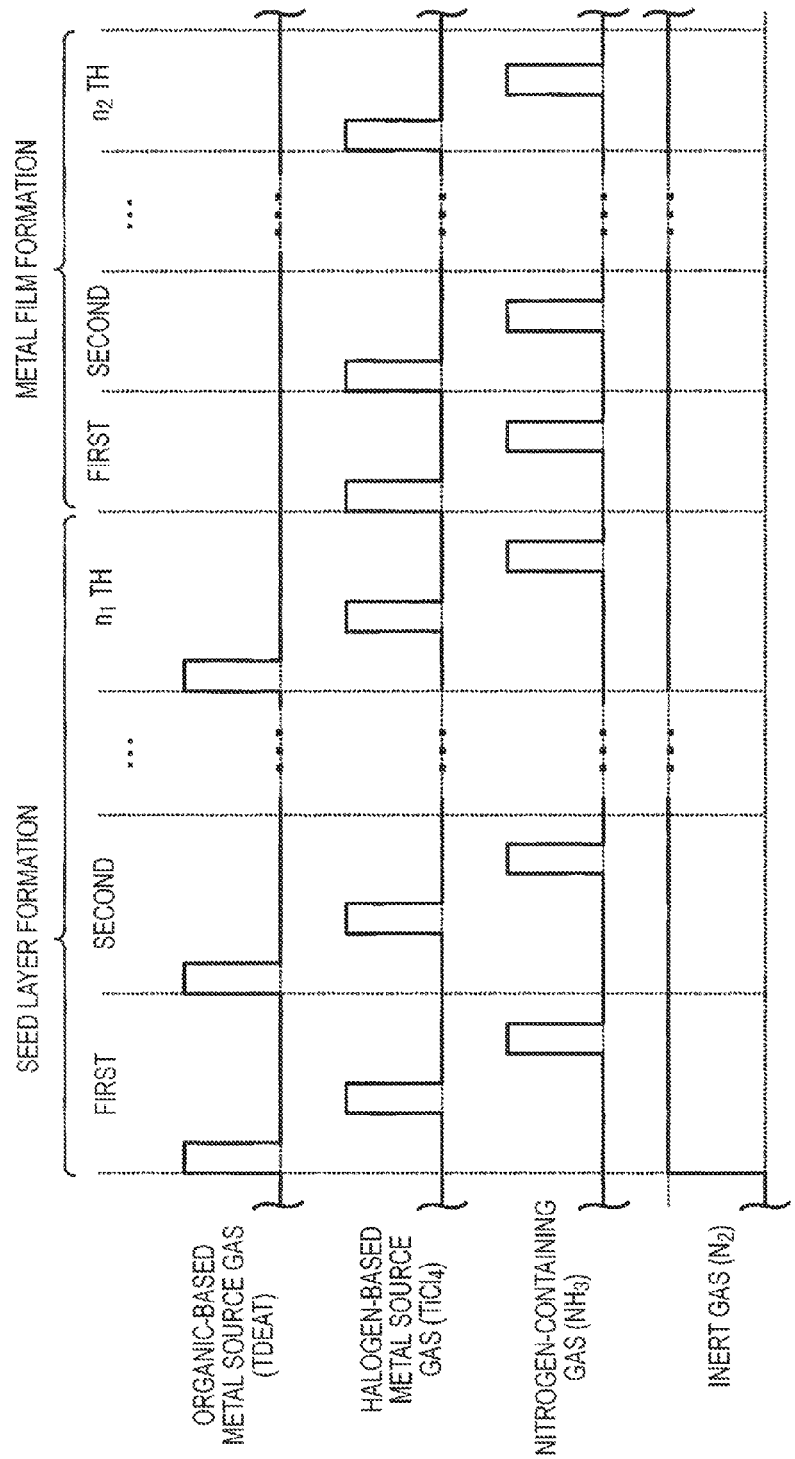
FIG. 6 is a diagram illustrating a sequence in a third embodiment of the present invention.

In contrast with the first embodiment, in the third embodiment, as illustrated in FIG. 6, in forming a seed layer, an organic metal-containing gas supply step, a halogen-based metal-containing gas supply step, and in addition, an N-containing gas supply step are performed in order in a time-division manner a predetermined number of times. More specifically, by performing a cycle at least once (predetermined number of times), the cycle performing the organic metal-containing gas supply step, a residual gas removal step, the halogen-based metal-containing gas supply step, a residual gas removal step, the N-containing gas supply step, a residual gas removal step in order in a time-division manner, a low nuclear density seed layer (TiN layer) is formed on a wafer 200. The N-containing gas supply step is performed using the same procedure and processing condition as the N-containing gas supply step performed when directly forming the metal-containing film on the seed layer.

Effect of the Present Embodiment

With the present embodiment, one or more effects set forth below are obtained.

(A) By forming the seed layer (TiN layer) whose nuclear density is lower than the normal metal film on the wafer 200, it is possible to increase the grain size of the metal film (TiN film) directly formed on the seed layer in comparison with the case of not forming the seed layer, and it is possible to provide the metal film capable of suppressing increase in resistivity of the metal film due to thinning in comparison with the case of not forming the seed layer. (B) When forming the seed layer, by forming the seed layer by supplying the organic metal source gas before the inorganic metal source gas (organic first), it is possible to improve surface roughness of the layer.

Fourth Embodiment of the Present Invention

In the third embodiment of the present invention, the example has been described of, in forming the seed layer, performing the organic metal-containing gas supply step, the halogen-based metal-containing gas supply step, and the N-containing gas supply step in order in a time-division manner a predetermined number of times. For a fourth embodiment, description is omitted for a part same as the third embodiment, and a different part from the third embodiment is described below.

Figure 7:
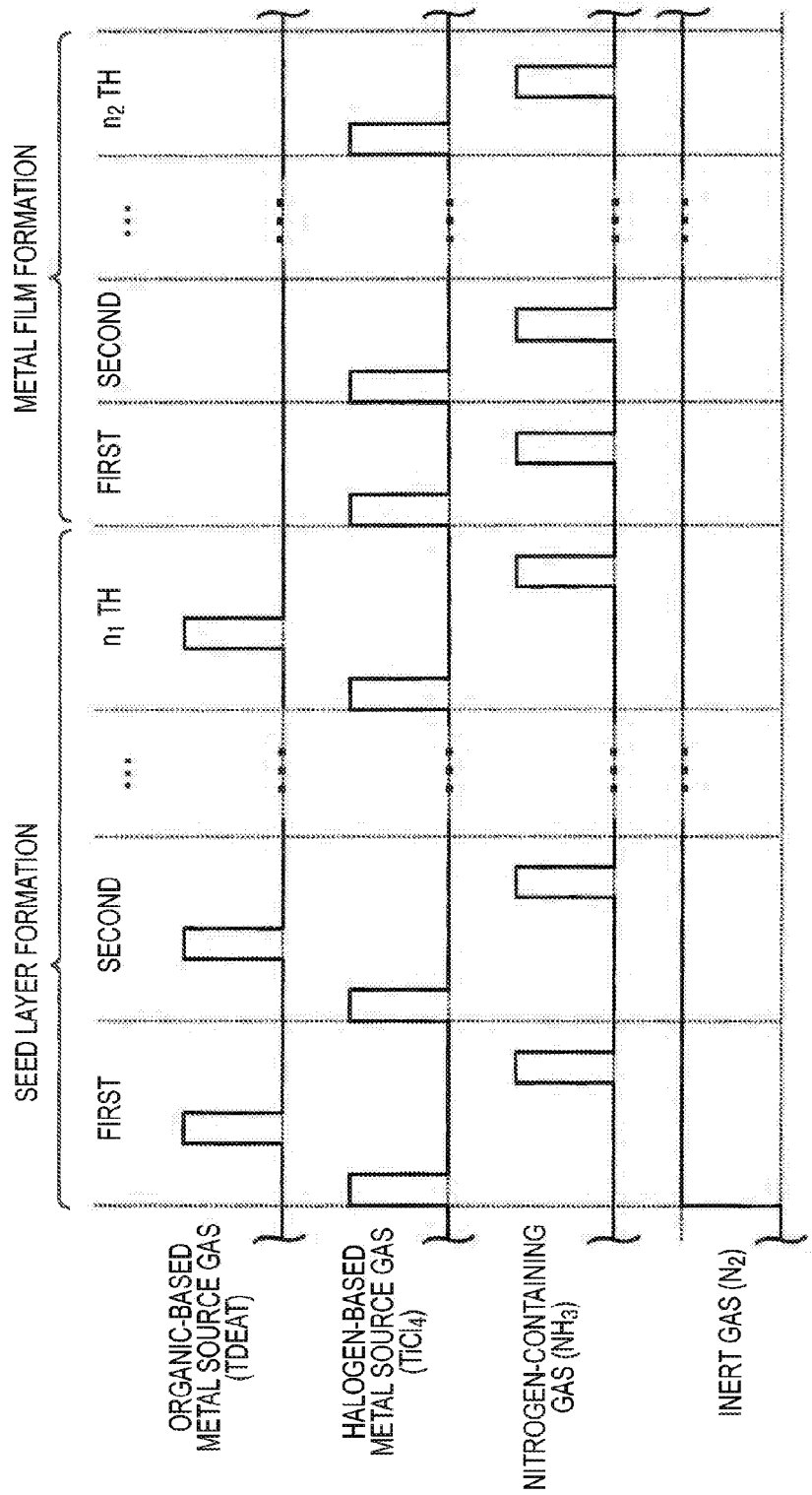
FIG. 7 is a diagram illustrating a sequence in a fourth embodiment of the present invention.

In contrast with the third embodiment, in the fourth embodiment, as illustrated in FIG. 7, in forming a seed layer, a halogen-based metal-containing gas supply step, an organic metal-containing gas supply step, and an N-containing gas supply step are performed in order in a time-division manner a predetermined number of times. More specifically, where processing of the halogen-based metal-containing gas supply step, a residual gas removal step, the organic metal-containing gas supply step, a residual gas removal step, the N-containing gas supply step, a residual gas removal step is one cycle, by executing the processing $n_1$ cycles ($n_1$ is an integer equal to or greater than 1), a low nuclear density seed layer (TiN layer) is formed on a wafer 200.

As described above, in the third embodiment, in forming the seed layer, each step has been performed in order of the organic metal-containing gas supply step, the halogen-based metal-containing gas supply step, the N-containing gas supply step; however, in the fourth embodiment, in forming the seed layer, each step is performed in order of the halogen-based metal-containing gas supply step, the organic metal-containing gas supply step, the N-containing gas supply step.

Effect of the Present Embodiment

With the present embodiment, an effect set forth below is obtained.

(A) By forming the seed layer (TiN layer) whose nuclear density is lower than the normal metal film on the wafer 200, it is possible to increase the grain size of the metal film (TiN film) directly formed on the seed layer in comparison with the case of not forming the seed layer, and it is possible to provide the metal film capable of suppressing increase in resistivity of the metal film due to thinning in comparison with the case of not forming the seed layer.

Other Embodiment of the Present Invention

The present invention is not limited to the embodiments described above, and is possible to be variously modified in the scope without departing from the gist of the invention.

The embodiments above described the examples of forming the seed layer on the wafer 200 by performing to the wafer 200 supplying the inorganic metal-containing gas and supplying the organic metal-containing gas in a time-division manner a predetermined number of times. At this time, the number of times of supplying the inorganic metal-containing gas and the number of times of supplying the organic metal-containing gas may be the same, or may be different from each other. When the number of times of supplying the organic metal-containing gas is greater than the number of times of supplying the inorganic metal-containing gas, a ligand containing more C, N, H is taken into the seed layer, so that it is possible to increase the grain size of the seed layer. That is, it is possible to form a seed layer of a lower nuclear density. Specifically, to one time of supplying the inorganic metal-containing gas included in one cycle, the number of times of supplying the organic metal-containing gas is two or more times.

The embodiments above described the examples of forming the metal nitride film on the wafer 200 by performing to the wafer 200 supplying the inorganic metal-containing gas, supplying the organic metal-containing gas, supplying the nitrogen-containing gas in a time-division manner a predetermined number of times. At this time, the number of times of supplying the inorganic metal-containing gas, the number of times of supplying the organic metal-containing gas, the number of times of supplying the nitrogen-containing gas may be the same, or may be different from each other. By changing (regulating, controlling) the number of times, it is possible to modulate (control, regulate, adjust, tune) the resistivity of the metal nitride film to be obtained. For example, when the number of times of supplying the organic metal-containing gas is greater than the number of times of supplying the inorganic metal-containing gas, more Cis taken into the metal nitride film, so that it is possible to further decrease the resistivity of the metal nitride film. When the number of times of supplying the inorganic metal-containing gas is greater than the number of times of supplying the organic metal-containing gas, C taken into the metal nitride film decreases, so that it is possible to further increase the resistivity of the metal nitride film. When the number of times of supplying the nitrogen-containing gas is greater than the number of times of supplying the inorganic metal-containing gas or the organic metal-containing gas, nitridation is more accelerated, so that it is possible to further increase the resistivity of the metal nitride film.

The embodiments above described the examples of, in directly forming the metal film on the seed layer formed on the wafer 200, supplying the halogen-based metal-containing gas and the N-containing gas in a time-division manner a predetermined number of times. In contrast, in directly forming the metal film on the seed layer formed on the wafer 200, the halogen-based metal-containing gas and the N-containing gas can be simultaneously supplied.

The embodiments above described the examples of, in directly forming the metal film on the seed layer formed on the wafer 200, supplying the halogen-based metal-containing gas and the N-containing gas in a time-division manner a predetermined number of times. In contrast, in directly forming the metal film on the seed layer formed on the wafer 200, the organic metal-containing gas can be used instead of the halogen-based metal source gas. Further, the organic metal-containing gas and the N-containing gas can be simultaneously supplied.

The embodiments above described the examples of using Ti as the metal element. The present invention is not limited to the embodiments described above, and can be suitably applied to forming a film containing an element such as tantalum (Ta), tungsten (W), cobalt (Co), yttrium (Y), ruthenium (Ru), aluminum (Al), hafnium (Hf), zirconium (Zr), molybdenum (Mo), silicon (Si), as the element other than Ti, the film being any one of films of a nitride film, an oxide film, a carbide film, a boride film, or a composite film thereof.

When forming the film containing the element described above, as the source gas other than titanium (Ti)-containing gas, it is possible to use tantalum (Ta)-containing gas, tungsten (W)-containing gas, cobalt (Co)-containing gas, yttrium (Y)-containing gas, ruthenium (Ru)-containing gas, aluminum (Al)-containing gas, hafnium (Hf)-containing gas, zirconium (Zr)-containing gas, molybdenum (Mo)-containing gas, silicon (Si)-containing gas, and the like.

When forming the film containing the element described above, as the halogen-based source gas as the inorganic metal-containing gas, other than $TiCl_4$, it is also possible to use, for example, tetrafluoride titanium ($TiF_4$), pentachloride tantalum ($TaCl_5$), pentafluoride tantalum ($TaF_5$), hexachloride tungsten ($WCl_6$), hexafluoride tungsten ($WF_6$), dichloride cobalt ($CoCl_2$), dichloride cobalt ($CoF_2$), trichloride yttrium ($YCl_3$), trifluoride yttrium ($YF_3$), trichloride ruthenium ($RuCl_3$), trifluoride ruthenium ($RuF_3$), trichloride aluminum ($AlCl_3$), trifluoride aluminum ($AlF_3$), tetrachloride hafnium ($HfCl_4$), tetrafluoride hafnium ($HfF_4$), tetrachloride zirconium (ZrCl$_4$), tetrafluoride zirconium (ZrF$_4$), tetrachlorosilane, that is, silicon tetrachloride or tetrachloride silicon (SiCl$_4$, abbreviation: SIC), dichlorosilane(SiH$_2$Cl$_2$, abbreviation: DCS), monochlorosilane (SiH$_3$Cl, abbreviation: MCS), hexachlorodisilane, that is, hexachloride disilicon (Si$_2$Cl$_6$, abbreviation: HODS).

When forming the film containing the element described above, as the organic metal-containing gas, for example, other than TDEAT, it is possible to use, for example, tetrakis(dimethylamino)titanium (Ti[N(CH$_3$)$_2$]$_4$, abbreviation: TDMAT), pentaethoxytantalum (Ta(OC$_2$H$_5$)$_5$, abbreviation: PET), trimethyl aluminum ((CH$_3$)$_3$Al, abbreviation: TMA), tetrakis(ethylmethylamino)hafnium (Hf[N(CH$_3$)CH$_2$CH$_3$]$_4$, abbreviation: TEMAH), tetrakis(dimethylamino)hafnium (Hf[N(CH$_3$)$_2$]$_4$, TDMAH), tetrakis diethylamino hafnium (Hf[N(C$_2$H$_5$)$_2$]$_4$, abbreviation: TDEAH), tetrakis(ethylmethylamino)zirconium (Zr[N(CH$_3$)CH$_2$CH$_3$]$_4$, abbreviation: TEMAZ), tetrakis(dimethylamino)zirconium (Zr[N(CH$_3$)$_2$]$_4$, TDMAZ), tetrakis diethylamino zirconium (Zr[N(C$_2$H$_5$)$_2$]$_4$, abbreviation: TDEAZ), tris(dimethylamino)cyclopentadienylzirconium ((C$_5$H$_5$)Zr[N(CH$_3$)$_2$]$_3$), tetrakis(dimethylamino)silane (Si[N(CH$_3$)$_2$]$_4$, abbreviation: 4DMAS), tris(dimethylamino)silane (Si[N(CH$_3$)$_2$]$_3$H, abbreviation: 3DMAS), bis(diethylamino)silane (Si[N(C$_2$H$_5$)$_2$]$_2$H$_2$, abbreviation: BDEAS), bis(tert-butylamino)silane (SiH$_2$[NH(C$_4$H$_9$)]$_2$, abbreviation: BTBAS), bis(tert-butylimino)bis(tert-butylamino)tungsten ((C$_4$H$_9$NH)$_2$W(C$_4$H$_9$N)$_2$), tungsten hexacarbonyl (W(CO)$_6$), bis(ethylcyclopentadienyl)cobalt (C$_{14}$H$_{18}$Co), cobalt hexacarbonyl (CoCO)$_6$), tris(buthylcyclopentadienyl) yttrium (Y(C$_5$H$_4$CH$_2$(CH$_2$)$_2$CH$_2$)$_3$), bis(ethylcyclopentadienyl)ruthenium.

When forming the film containing the element described above, as the reaction gas, other than NH$_3$, it is possible to use the gas containing N—H bond, for example, nitrogen (N$_2$), nitrous oxide (N$_2$O), diazene (N$_2$H$_2$) gas, hydrazine (N$_2$H$_4$) gas, N$_3$H$_8$ gas. In addition, as the gas containing N—H bond, other than the gas described above, it is possible to use organic hydrazine-based gas, methyl hydrazine-based gas, for example, monomethyl hydrazine ((CH$_3$)HN$_2$H$_2$, abbreviation: MMH) gas, dimethyl hydrazine ((CH$_3$)$_2$N$_2$H$_2$, abbreviation: DMH) gas, trimethyl hydrazine ((CH$_3$)$_2$N$_2$(CH$_3$)H, abbreviation: TMH) gas, and ethyl hydrazine-based gas such as ethyl hydrazine ((C$_2$H$_5$)HN$_2$H$_2$, abbreviation: EH) gas. In addition, it is possible to use ethylamine-based gas such as triethylamine ((C$_2$H$_5$)$_3$N, abbreviation: TEA) gas, diethylamine ((C$_2$H$_5$)$_2$NH, abbreviation: DEA) gas, monoethylamine (C$_2$H$_5$NH$_2$, abbreviation: MEA) gas, methylamine-based gas such as trimethyl amine ((CH$_3$)$_3$N, abbreviation: TMA) gas, dimethylamine ((CH$_3$)$_2$NH, abbreviation: DMA) gas, monomethylamine (CH$_3$NH$_2$, abbreviation: MMA) gas, propylamine-based gas such as tripropylamine ((C$_3$H$_7$)$_3$N, abbreviation: TPA) gas, dipropylamine ((C$_3$H$_7$)$_2$NH, abbreviation: DPA) gas, monopropylamine (C$_3$H$_7$NH$_2$, abbreviation: MPA) gas, isopropylamine-based gas such as triisopropylamine ([(CH$_3$)$_2$CH]$_3$N, abbreviation: TIPA) gas, diisopropylamine ([(CH$_3$)$_2$CH]$_2$NH, abbreviation: DIPA) gas, monoisopropylamine ((CH$_3$)$_2$CHNH$_2$, abbreviation: MIPA) gas, butylamine-based gas such as tributylamine ((C$_4$H$_9$)$_3$N, abbreviation: TBA) gas, dibutylamine ((C$_4$H$_9$)$_2$NH, abbreviation: DBA) gas, monobutylamine (C$_4$H$_9$NH$_2$, abbreviation: MBA) gas, or isobutylamine-based gas such as triisobutylamine ([(CH$_3$)$_2$CHCH$_2$]$_3$N, abbreviation: TIBA) gas, diisobutylamine ([(CH$_3$)$_2$CHCH$_2$]$_2$NH, abbreviation: DIBA) gas, monoisobutylamine ((CH$_3$)$_2$CHCH$_2$NH$_2$, abbreviation: MIBA) gas. That is, as the amine-based gas, it is possible to use at least one of a plurality types of gas expressed by a composition formula, for example, (C$_2$H$_5$)$_x$NH$_{3-x}$, (CH$_3$)$_x$NH$_{3-x}$, (C$_3$H$_7$)$_x$NH$_{3-x}$, [(CH$_3$)$_2$CH]$_x$NH$_{3-x}$, (C$_4$H$_9$)$_x$NH$_{3-x}$, [(CH$_3$)$_2$CHCH$_2$]$_x$NH$_{3-x}$ (where, x is an integer of 1-3). When using the organic hydrazine-based gas and the amine-based gas, it is possible to increase the reactivity and to take C into the film, so that it is possible to regulate the work function of the film by controlling the density of C.

For example, other than the Ti film, TiN film, TiC film, TiCN film, the applicable seed layer and metal film include films such as a Doped-TiCN film, tantalum film (Ta film), tantalum nitride film (TaN film), tantalum carbide film (TaC film), tantalum carbonitride film (TaCN film), Doped-TaCN film, tungsten film (W film), tungsten nitride film (WN film), tungsten carbide film (WC film), tungsten carbonitride film (WCN film), Doped-WCN film, cobalt film (Co film), cobalt nitride film (CoN film), cobalt carbide film (CoC film), cobalt carbonitride film (CoCN film), Doped-CoCN film, yttrium film (Y film), yttrium nitride film (YN film), yttrium carbide film (YC film), yttrium carbonitride film (YCN film), Doped-YCN film, ruthenium film (Ru film), ruthenium nitride film (RuN film), ruthenium carbide film (RuC film), ruthenium carbonitride film (RuCN film), Doped-RuCN film, aluminum film (Al film), aluminum nitride film (AlN film), aluminum carbide film (AlC film), aluminum carbonitride film (AlCN film), Doped-AlCN film, hafnium film (Hf film), hafnium nitride film (HfN film), hafnium carbide film (HfC film), hafnium carbonitride film (HfCN film), Doped-HfCN film, zirconium film (Zr film), zirconium nitride film (ZrN film), zirconium carbide film (ZrC film), zirconium carbonitride film (ZrCN film), Doped-ZrCN film, molybdenum film (Mo film), molybdenum nitride film (MoN film), molybdenum carbide film (MoC film), molybdenum carbonitride film (MoCN film), Doped-MoCN film, silicon film (Si film), silicon nitride film (SiN film), silicon carbide film (SiC film), silicon carbonitride film (SiCN film), Doped-SiCN film, silicon oxycarbonitride film (SiOCN film).

The embodiments above, described the examples of using the N$_2$ gas as the inert gas, but the present invention is not limited thereto. Rare gas can be used, such as Ar gas, He gas, Ne gas, Xe gas.

The embodiments above described the examples of film-forming using the substrate processing apparatus that is a batch type vertical apparatus for processing multiple substrate at a time, which is the processing furnace having the structure in which the nozzle for supplying the processing gas in one reaction tube is stood and the exhaust port is provided at the lower part of the reaction tube; however, it is possible to apply the present invention to film-forming in a case of using a processing furnace having the other structure. For example, it is also possible to apply the present invention to film-forming in a case of using a processing furnace having a structure that has two reaction tubes having concentric cross section (outer side reaction tube is referred to as outer tube, inner side reaction tube is referred to as inner tube) and in which the processing gas flows from the nozzle stood in the inner tube to the exhaust port opening at a position of the side wall of the outer tube that faces the nozzle sandwiching the substrate (position of line symmetry). In addition, the processing gas can be supplied from the gas supply port opening at the side wall of the inner tube instead of being supplied from the nozzle stood in the inner tube. At this time, the exhaust port opening at the outer tube can be opened depending on the height in which multiple substrates accommodated being laminated in the processing chamber. In addition, the shape of the exhaust port can be a hole shape, and also can be a slit shape.

The embodiments above described the examples of film-forming using the substrate processing apparatus that is a batch type vertical apparatus for processing multiple substrates at a time; however, the present invention is not limited thereto, and can be suitably applied to film-forming in a case of using a single wafer substrate processing apparatus for processing one or more substrates at a time. The embodiments above described the examples of film-forming of the thin film using the substrate processing apparatus having a processing furnace of a hot wall type; however, the present invention is not limited thereto, and can also be suitably applied to film-forming of the thin film in a case of using a substrate processing apparatus having a processing furnace of a cold wall type. Also in these cases, the processing condition can be, for example, the same processing condition as the embodiments described above.

Figure 8:
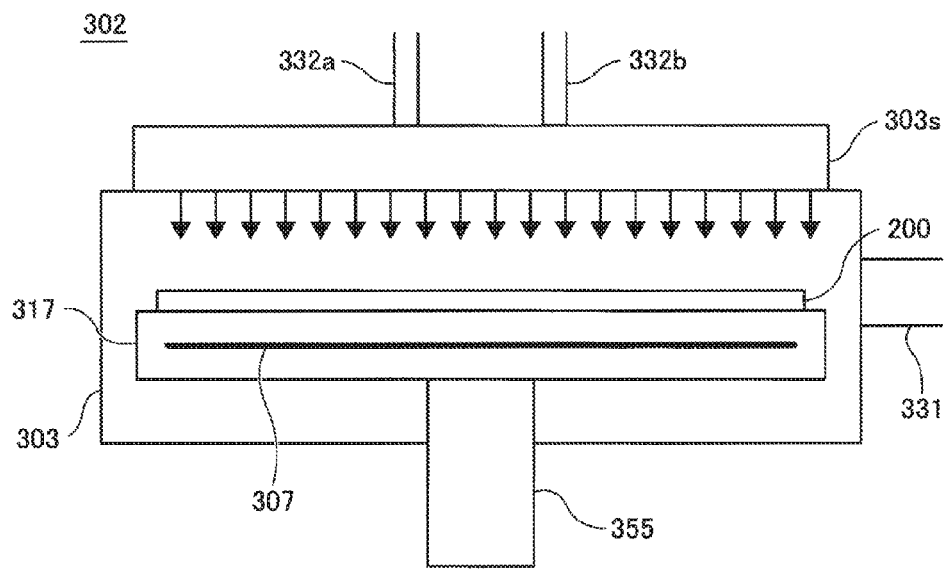
FIG. 8 is a schematic diagram of a processing furnace of a substrate processing apparatus suitably used in another embodiment of the present invention, and is a diagram illustrating the processing furnace part with a longitudinal section.

For example, the present invention can also be suitably applied to forming the film in a case of using the substrate processing apparatus including a processing furnace 302 illustrated in FIG. 8. The processing furnace 302 includes a processing container 303 that forms a processing chamber 301, a shower head 303s for supplying gas into the processing chamber 301 like a shower, a support base 317 for supporting one or more wafers 200 in a horizontal position, a rotation shaft 355 for supporting the support base 317 from below, and a heater 307 provided to the support base 317. An inlet (gas introduction port) of the shower head 303s is connected to a gas supply port 332a for supplying the source gas described above and a gas supply port 332b for supplying the reaction gas described above. The gas supply port 332a is connected to the same source gas supply system as the source gas supply system of the embodiments described above. The gas supply port 332b is connected to the same reaction gas supply system as the reaction gas supply system of the embodiments described above. An outlet (gas discharge port) of the shower head 303s is provided with a gas dispersion plate for supplying the gas into the processing chamber 301 like a shower. The processing container 303 is provided with an exhaust port 331 for exhausting the inside of the processing chamber 301. The exhaust port 331 is connected to the same exhaust system as the exhaust system of the embodiments described above.

Figure 9:
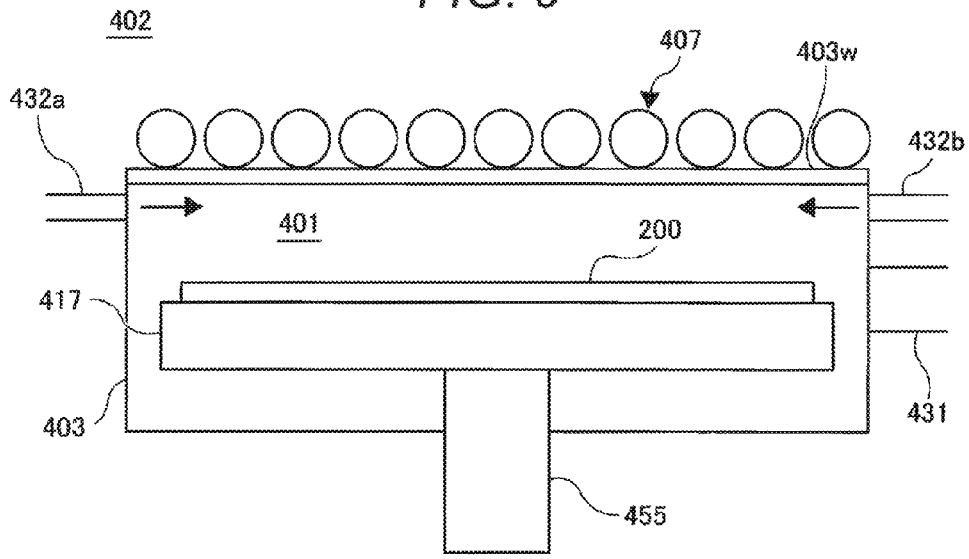
FIG. 9 is a schematic diagram of a processing furnace of a substrate processing apparatus suitably used in a yet another embodiment of the present invention, and is a diagram illustrating the processing furnace part with a longitudinal section.

In addition, the present invention can also be suitably applied to forming the film in a case of using the substrate processing apparatus including a processing furnace 402 illustrated in FIG. 9, for example. The processing furnace 402 includes a processing container 403 that forms a processing chamber 401, a support base 417 for supporting one or more wafers 200 in a horizontal position, a rotation shaft 455 for supporting the support base 417 from below, a lamp heater 407 for light irradiation toward the wafers 200 of the processing container 403, and a quartz window 403w through which light of the lamp heater 407 transmits. The processing container 403 is connected to a gas supply port 432a for supplying the source gas described above and a gas supply port 432b for supplying the reaction gas described above. The gas supply port 432a is connected to the same source gas supply system as the source gas supply system of the embodiments described above. The gas supply port 432b is connected to the same reaction gas supply system as the reaction gas supply system of the embodiments described above. The processing container 403 is provided with an exhaust port 431 for exhausting the inside of the processing chamber 401. The exhaust port 431 is connected to the same exhaust system as the exhaust system of the embodiments described above.

Also in cases of using these substrate processing apparatuses, it is possible to perform film-forming by the same sequence, processing condition as the embodiments described above.

For a process recipe (program in which processing procedure, processing condition, and the like are written) used for forming these various types of thin films, it is preferable to individually prepare the recipe (prepare multiple recipes) depending on a detail (type, composition ratio, film quality, film thickness, processing procedure, processing condition, and the like of thin film to be formed) of the substrate processing. It is preferable to properly select an appropriate process recipe from the multiple process recipes depending on the detail of the substrate processing when starting the substrate processing. Specifically, for the multiple process recipes individually prepared depending on the detail of the substrate processing, it is preferable to store (install) in advance in a memory device 121c included in the substrate processing apparatus via a telecommunication line or a recording medium (external memory device 123) that stores the process recipes. It is preferable that a CPU 121a included in the substrate processing apparatus properly selects the appropriate process recipe from the multiple process recipes stored in the memory device 121c depending on the detail of the substrate processing when starting the substrate processing. By configuring this way, it becomes possible to form the thin film of various film types, composition ratios, film quality, film thickness by one substrate processing apparatus generally and with high reproducibility. In addition, it becomes possible to reduce a work load of an operator (input load of processing procedure, processing condition, and the like), and to quickly start the substrate processing while avoiding an operation error.

In addition, the present invention can also be achieved, for example, by changing the process recipe of an existing substrate processing apparatus. When changing the process recipe, it is possible to install the process recipe according to the present invention to the existing substrate processing apparatus via the telecommunication line or the recording medium that stores the process recipe, or to operate an input/output device of the existing substrate processing apparatus to change the process recipe itself to the process recipe according to the present invention.

Hereinafter, desired embodiments of the present invention are noted.

[Note 1]

A method of manufacturing a semiconductor device or a method of processing a substrate, including:

forming a seed layer containing a metal element on a substrate by performing a first process and a second process in a time-division manner (asynchronous, intermittent, pulsed manner) a predetermined number of times, the first process supplying and exhausting organic metal-containing gas containing the metal element to the substrate, the second process supplying and exhausting inorganic metal-containing gas containing the metal element to the substrate; and forming a metal-containing nitride film on the substrate on which the seed layer is formed by using the seed layer as a seed by performing a third process and a fourth process in a time-division manner (asynchronous, intermittent, pulsed manner) a predetermined number of times, the third process supplying and exhausting the inorganic metal-containing gas to the substrate, the fourth process supplying and exhausting nitrogen-containing gas to the substrate.

[Note 2]

The method of manufacturing a semiconductor device according to Note 1, wherein a first nuclear density is lower than a second nuclear density, where the first nuclear density is a nuclear density of the seed layer and the second nuclear density is a nuclear density of the metal-containing nitride film of when the metal-containing nitride film is formed without using the seed layer on the substrate.

[Note 3]

The method of manufacturing a semiconductor device according to Note 1 or 2, wherein forming the seed layer performs supplying and exhausting the organic metal-containing gas and supplying and exhausting the inorganic metal-containing gas in order in a time-division manner a predetermined number of times.

[Note 4]

The method of manufacturing a semiconductor device according to Note 1 or 2, wherein forming the seed layer performs supplying and exhausting the inorganic metal-containing gas and supplying and exhausting the organic metal-containing gas in order in a time-division manner a predetermined number of times.

[Note 5]

The method of manufacturing a semiconductor device according to any of Notes 1 to 4, wherein forming the seed layer includes further supplying and exhausting the nitrogen-containing gas.

[Note 6]

The method of manufacturing a semiconductor device according to Note 5, wherein forming the seed layer performs supplying and exhausting the organic metal-containing gas, supplying and exhausting the inorganic metal-containing gas, and supplying and exhausting the nitrogen-containing gas in order in a time-division manner a predetermined number of times.

[Note 7]

The method of manufacturing a semiconductor device according to Note 5, wherein forming the seed layer performs supplying and exhausting the inorganic metal-containing gas, supplying and exhausting the organic metal-containing gas, and supplying and exhausting the nitrogen-containing gas in order in a time-division manner a predetermined number of times.

[Note 8]

The method of manufacturing a semiconductor device according to any of Notes 1 to 7, wherein the organic metal-containing gas contains at least one of an ethyl group and a methyl group, and the inorganic metal-containing gas contains a halogen group.

[Note 9]

The method of manufacturing a semiconductor device according to any of Notes 1 to 8, wherein the metal element is any one of titanium (Ti), tantalum (Ta), tungsten (W), cobalt (Co), yttrium (Y), ruthenium (Ru), aluminum (Al), hafnium (Hf), zirconium (Zr), molybdenum (Mo).

[Note 10]

The method of manufacturing a semiconductor device according to any of Notes 1 to 9, wherein forming a seed layer containing the metal element on the substrate performs supplying and exhausting organic metal-containing gas and supplying and exhausting the inorganic metal-containing gas once each.

[Note 11]

A method of manufacturing a semiconductor device or a method of processing a substrate, including:

forming a seed layer containing a metal element on a substrate by performing a first process and a second process in a time-division manner (asynchronous, intermittent, pulsed manner) a predetermined number of times, the first process supplying and exhausting organic metal-containing gas containing the metal element to the substrate, the second process supplying and exhausting inorganic metal-containing gas containing the metal element to the substrate; and forming a metal-containing nitride film on the substrate on which the seed layer is formed by using the seed layer as a seed by performing a third process and a fourth process simultaneously a predetermined number of times, the third process supplying and exhausting the inorganic metal-containing gas to the substrate, the fourth process supplying and exhausting nitrogen-containing gas to the substrate.

[Note 12]

A substrate processing apparatus including:

a processing chamber configured to accommodate a substrate;

a gas supply system configured to supply organic metal-containing gas containing a metal element and inorganic metal-containing gas containing the metal element, nitrogen-containing gas to the substrate; and a control unit configured to perform processing of forming a seed layer containing the metal element on the substrate by controlling the gas supply system by performing a first processing and a second processing in a time-division manner (asynchronous, intermittent, pulsed manner) a predetermined number of times, the first processing supplying and exhausting the organic metal-containing gas to the substrate accommodated in the processing chamber, the second processing supplying and exhausting the inorganic metal-containing gas to the substrate, and processing of forming a metal-containing nitride film on the substrate on which the seed layer is formed by using the seed layer as a seed by performing a third processing and a fourth processing in a time-division manner (asynchronous, intermittent, pulsed manner) a predetermined number of times, the third processing supplying and exhausting the inorganic metal-containing gas to the substrate, the fourth processing supplying and exhausting nitrogen-containing gas to the substrate.

[Note 13]

A program that causes a computer to execute procedures and a non-transitory computer-readable recording medium storing the program, the procedures includes:

a procedure of forming a seed layer on the substrate by performing a first procedure and a second procedure in a time-division manner (asynchronous, intermittent, pulsed manner) a predetermined number of times, the first procedure supplying and exhausting organic metal-containing gas containing a metal element to a substrate, the second procedure supplying and exhausting inorganic metal-containing gas containing the metal element to the substrate; and a procedure of forming a metal-containing nitride film on the substrate on which the seed layer is formed using the seed layer as a seed by performing a third procedure and a fourth procedure in a time-division manner (asynchronous, intermittent, pulsed manner) a predetermined number of times, the third procedure supplying and exhausting the inorganic metal-containing gas to the substrate, the fourth procedure supplying and exhausting nitrogen-containing gas to the substrate.

What is claimed is:

1. A method of manufacturing a semiconductor device comprising:

forming a seed layer containing a metal element on a substrate by performing a first process and a second process in a time-division manner a predetermined number of times, the first process supplying and exhausting organic metal-containing gas containing the metal element to the substrate, the second process supplying and exhausting inorganic metal-containing gas containing the metal element to the substrate; and forming a metal-containing nitride film on the substrate on which the seed layer is formed using the seed layer as a seed by performing a third process and a fourth process in a time-division manner a predetermined number of times, the third process supplying and exhausting the inorganic metal-containing gas to the substrate, the fourth process supplying and exhausting nitrogen-containing gas to the substrate.

2. The method of manufacturing a semiconductor device according to claim 1, wherein a first nuclear density is lower than a second nuclear density, wherein the first nuclear density is a nuclear density of the seed layer and the second nuclear density is a nuclear density of the metal-containing nitride film when the metal-containing nitride film is formed without using the seed layer on the substrate.

3. The method of manufacturing a semiconductor device according to claim 1, wherein in the forming of the seed layer, the first process and the second process are performed in order in a time-division manner a predetermined number of times.

4. The method of manufacturing a semiconductor device according to claim 1, wherein in the forming of the seed layer, the second process and the first process are performed in order in a time-division manner a predetermined number of times.

5. The method of manufacturing a semiconductor device according to claim 1, wherein forming the seed layer further includes a fifth process of supplying and exhausting the nitrogen-containing gas.

6. The method of manufacturing a semiconductor device according to claim 5, wherein the first process, the second process and the fifth process are performed in order and in a time-division manner a predetermined number of times in the forming of the seed layer.

7. The method of manufacturing a semiconductor device according to claim 5, wherein the second process, the first process and the fifth process are performed in order and in a time-division manner a predetermined number of times in the forming of the seed layer.

8. The method of manufacturing a semiconductor device according to claim 1, wherein the organic metal-containing gas contains at least one of an ethyl group and a methyl group, and the inorganic metal-containing gas contains a halogen group.

9. The method of manufacturing a semiconductor device according to claim 1, wherein the metal element is any one of titanium, tantalum, tungsten, cobalt, yttrium, ruthenium, aluminum, hafnium, zirconium, or molybdenum.

10. The method of manufacturing a semiconductor device according to claim 1, wherein in the forming of the seed layer, the first process and the second process are each performed once.

11. A method of manufacturing a semiconductor device comprising:

forming a seed layer containing a metal element on a substrate by performing a first process and a second process in a time-division manner a predetermined number of times, the first process supplying and exhausting organic metal-containing gas containing the metal element to the substrate, the second process supplying and exhausting inorganic metal-containing gas containing the metal element to the substrate; and forming a metal-containing nitride film on the substrate on which the seed layer is formed using the seed layer as a seed by performing a third process and a fourth process simultaneously a predetermined number of times, the third process supplying and exhausting the inorganic metal-containing gas to the substrate, the fourth process supplying and exhausting nitrogen-containing gas to the substrate.

12. A non-transitory computer-readable recording medium storing a program that causes a computer to execute:

a procedure of forming a seed layer on the substrate by performing a first procedure and a second procedure in a time-division manner a predetermined number of times, the first procedure supplying and exhausting organic metal-containing gas containing a metal element to a substrate, the second procedure supplying and exhausting inorganic metal-containing gas containing the metal element to the substrate; and a procedure of forming a metal-containing nitride film on the substrate on which the seed layer is formed using the seed layer as a seed by performing a third procedure and a fourth procedure in a time-division manner a predetermined number of times, the third procedure supplying and exhausting the inorganic metal-containing gas to the substrate, the fourth procedure supplying and exhausting nitrogen-containing gas to the substrate.

* * * * *